US012216388B2

(12) United States Patent
Endo et al.

(10) Patent No.: US 12,216,388 B2
(45) Date of Patent: Feb. 4, 2025

(54) IMAGING APPARATUS

(71) Applicant: CANON KABUSHIKI KAISHA, Tokyo (JP)

(72) Inventors: Yosaku Endo, Kanagawa (JP); Hayato Mano, Tokyo (JP); Kazuo Yamamoto, Tokyo (JP); Hideki Toichi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 877 days.

(21) Appl. No.: 17/148,349

(22) Filed: Jan. 13, 2021

(65) Prior Publication Data

US 2021/0232024 A1 Jul. 29, 2021

(30) Foreign Application Priority Data

Jan. 27, 2020 (JP) ................................ 2020-011247
Mar. 25, 2020 (JP) ................................ 2020-054576

(51) Int. Cl.
*G03B 17/14* (2021.01)
*G03B 17/55* (2021.01)
(Continued)

(52) U.S. Cl.
CPC ............ *G03B 17/55* (2013.01); *G03B 17/14* (2013.01); *H04N 23/52* (2023.01); *H04N 23/54* (2023.01);
(Continued)

(58) Field of Classification Search
CPC ............ G03B 17/02–14; H04N 5/225; H04N 23/51–52
See application file for complete search history.

(56) References Cited

U.S. PATENT DOCUMENTS 8,477,238 B2 * 7/2013 Jannard .................. H04N 23/50 348/372
9,838,558 B2 * 12/2017 Petty ......................... G06F 1/20
(Continued)

FOREIGN PATENT DOCUMENTS

JP H10010626 A 1/1998
JP 2003-156790 A 5/2003
(Continued)

OTHER PUBLICATIONS

ProVideoCoalition article tiled "KOMODO: RED's new digital cinema camera arrives this Spring" <https://www.provideocoalition.com/komodo-reds-new-camera-arrives-this-spring/> dated Feb. 5, 2020 (Year: 2020).*

(Continued)

*Primary Examiner* — Leon W Rhodes, Jr.
(74) *Attorney, Agent, or Firm* — Canon U.S.A., Inc., IP Division

(57) ABSTRACT

An imaging apparatus includes a forced air cooling mechanism that uses driving of a fan. The imaging apparatus further includes a lens mount, an air intake port, and an air exhaust port. The lens mount is provided on a front surface of an apparatus main body. A lens device is detachably attachable to the lens mount. The air intake port is formed in a first protruding portion on a first side surface of the apparatus main body. The air exhaust port is formed in a second protruding portion on a second side surface of the apparatus main body. The second side surface is different from the first side surface.

18 Claims, 22 Drawing Sheets

(51) Int. Cl.
*H04N 23/52* (2023.01)
*H04N 23/54* (2023.01)
*H04N 23/55* (2023.01)
*H05K 7/20* (2006.01)

(52) U.S. Cl.
CPC ......... *H04N 23/55* (2023.01); *H05K 7/20136* (2013.01)

(56) References Cited

U.S. PATENT DOCUMENTS

| | | | | |
|---|---|---|---|---|
| 9,973,644 | B2 * | 5/2018 | Toichi | H04N 1/00984 |
| 10,771,671 | B2 * | 9/2020 | Lever | H04N 23/51 |

FOREIGN PATENT DOCUMENTS

| | | | |
|---|---|---|---|
| JP | 2007-028319 | A | 2/2007 |
| JP | 2007209035 | A | 8/2007 |
| JP | 2013-064929 | A | 4/2013 |
| JP | 2014045343 | A | 3/2014 |
| JP | 2015186056 | A | 10/2015 |
| JP | 2017-032884 | A | 2/2017 |
| JP | 2019045516 | A | 3/2019 |
| JP | 2020-013075 | A | 1/2020 |
| JP | 2022087160 | A | 6/2022 |

OTHER PUBLICATIONS

CineD article titled "RED Komodo Update—Dimensional Drawings Released, Production Starts" at <https://www.cined.com/red-komodo-update-dimensional-drawings-released-production-starts/> dated Feb. 5, 2020 (Year: 2020).*

Instagram post by Jarred Land (instajarred) "And that's a lock." at https://www.instagram.com/p/B8CAWvlhw7c/ dated Feb. 1, 2020 (Year: 2020).*

Instagram post by Jarred Land (instajarred) "Behind the scenes pics a clips." at https://www.instagram.com/p/B8UWpCChPvc/ dated Feb. 8, 2020 (Year: 2020).*

Instagram post by Jarred Land (instajarred) "Komodo dimensional drawings are now up for download" at https://www.instagram.com/p/B8Ks1IABOf0/ dated Feb. 4, 2020 (Year: 2020).*

Wikipedia article "Canon RF lens mount" at <https://en.wikipedia.org/w/index.php?title=Canon_RF_lens_mount&oldid=940714679>, Feb. 14, 2020 revision (Year: 2020).*

Instagram post by Jarred Land (instajarred) "Really really happy" at https://www.instagram.com/p/B065jwNBp1D/ dated Aug. 8, 2019 (Year: 2019).

Instagram post by Jarred Land (instajarred) "Boom Boom Boom" at https://www.instagram.com/p/B3FbVmuh64F/ dated Oct. 1, 2019 (Year: 2019).

Instagram post by Jarred Land (instajarred) "Damn I love this lens." at https://www.instagram.com/p/B45tAP7BsZz/ dated Nov. 15, 2019 (Year: 2019).

Instagram post by Jarred Land (instajarred) "@brook.willard DP of CBS #SealTeam" at https://www.instagram.com/p/B5LZjLpBgmxl dated Nov. 22, 2019 (Year: 2019).

Instagram post by Jarred Land (instajarred) "Prototype Komodo" at https://www.instagram.com/p/B6GZYMihDoV/ dated Dec. 15, 2019 (Year: 2019).

Instagram post by Jarred Land (instajarred) "So . . . as most of you know" at https://www.instagram.com/p/B1Fu_psh4KW/ dated Aug. 12, 2019 (Year: 2019).

Instagram post by Jarred Land (instajarred) "Always love catching up" at https://www.instagram.com/p/B40MIW_BZvS/ dated Nov. 8, 2019 (Year: 2019).

Wikipedia article "Canon RF lens mount" at <https://en.wikipedia.org/w/index.php?title=Canon_RF_lens_mount&oldid=939392068>, Dec. 1, 2019 revision (Year: 2019).

Post by Phil Holland on RedUsers. com forum thread titled "Komodo" at https://reduser.net/threads/komodo.184033/post-2766840 dated Nov. 16, 2019 (Year: 2019).

Post by andrewhake on RedUsers.com forum thread titled "Komodo" at https://reduser.net/threads/komodo.184033/post-2765960 dated Sep. 27, 2019 (Year: 2019).

* cited by examiner

IMAGING APPARATUS

BACKGROUND

Field

The present disclosure relates to an imaging apparatus including a forced air cooling mechanism using the driving of a fan.

Description of the Related Art

In recent years, in an imaging apparatus, due to the high resolution, such as 4K or 8K, or the high frame rate of a captured image or high dynamic range compatibility, the data rate of an image to be handled increases, and power consumption necessary for a calculation process or a recording process on image data also increases. Further, with the increase in power consumption, heat generation inside the imaging apparatus has become an issue.

As a countermeasure against such heat generation, an imaging apparatus including a forced air cooling mechanism such as a fan and a duct as discussed in Japanese Patent Application Laid-Open No. 2014-45343 has been developed.

In the imaging apparatus in Japanese Patent Application Laid-Open No. 2014-45343, cool air is drawn in from an air intake port, and the air containing heat generated inside the apparatus is exhausted from an air exhaust port of the imaging apparatus, thereby dissipating heat. However, in a case where the air intake port or the air exhaust port is placed down on a flat surface such as the ground, the air intake port or the air exhaust port may be blocked, thereby hindering the flow of air for forced air cooling. This may decrease heat exhaust efficiency. Thus, the temperature inside the imaging apparatus may rise, and the imaging apparatus may break down.

SUMMARY

According to an aspect of the present disclosure, an imaging apparatus having a forced air cooling mechanism configured to use driving of a fan includes a lens mount which is provided on a front surface of an apparatus main body and to which a lens device is detachably attachable, an air intake port formed in a first protruding portion on a first side surface of the apparatus main body, and an air exhaust port formed in a second protruding portion on a second side surface of the apparatus main body that is different from the first side surface.

Further features of the present disclosure will become apparent from the following description of exemplary embodiments with reference to the attached drawings.

DESCRIPTION OF THE EMBODIMENTS

A first exemplary embodiment of the present disclosure will be described below with reference to the drawings.

<External Appearance of Imaging Apparatus>

Figure 1:
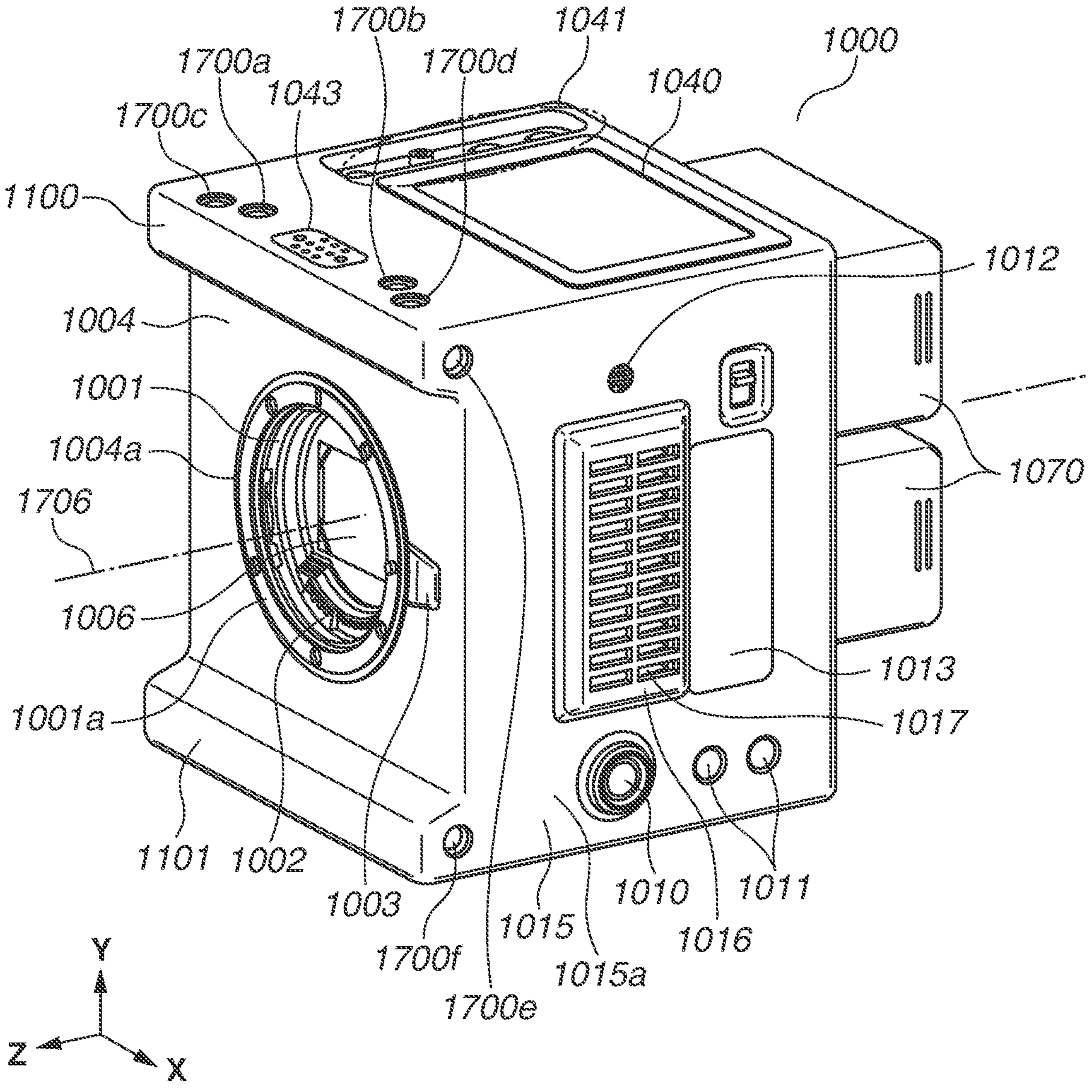
FIG. 1 is a front perspective view illustrating an imaging apparatus according to a first exemplary embodiment.
Figure 2:
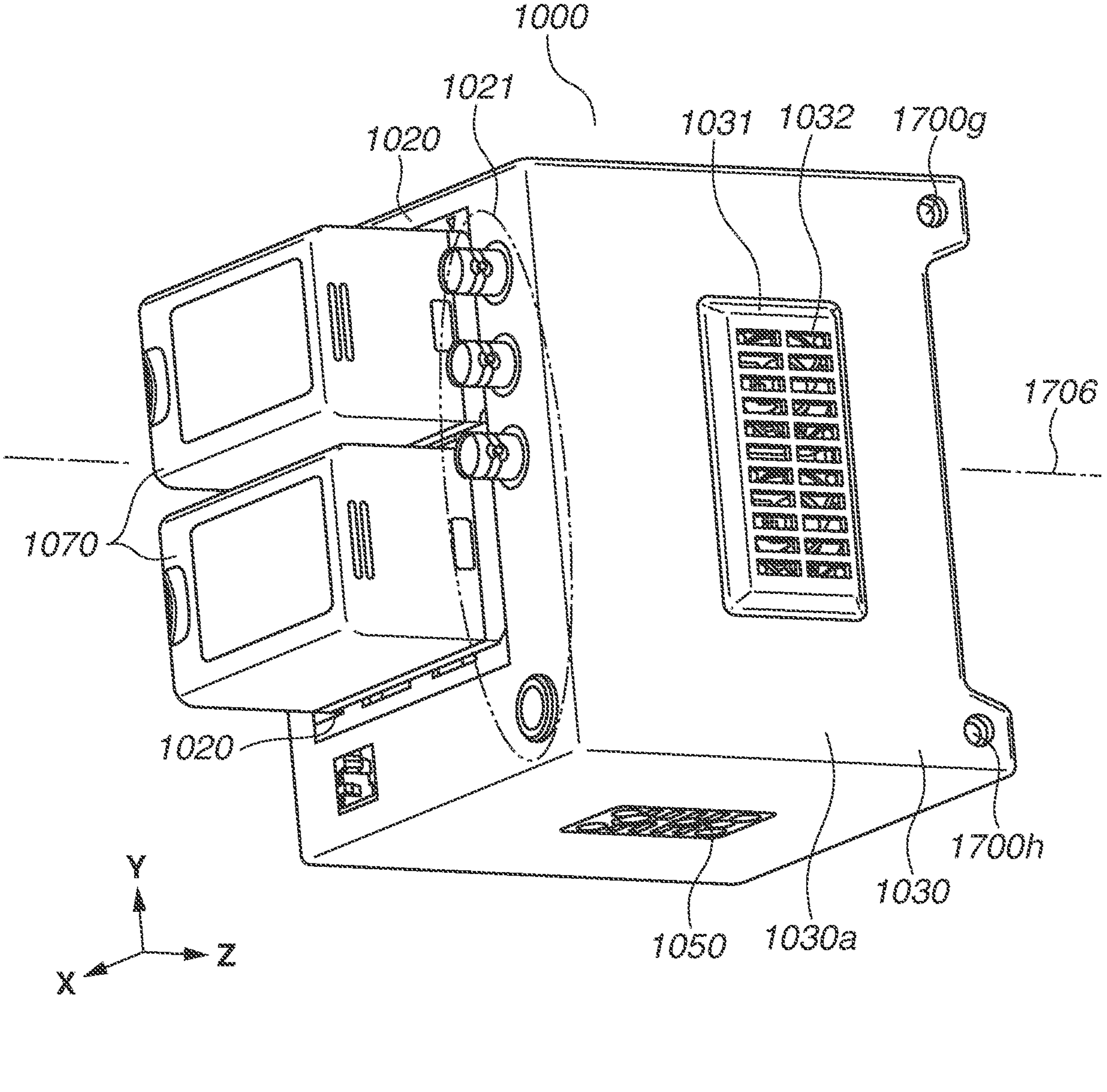
FIG. 2 is a rear perspective view illustrating the imaging apparatus according to the first exemplary embodiment.

FIG. 1 is a front perspective view of an imaging apparatus according to an exemplary embodiment of the present disclosure. FIG. 2 is a rear perspective view of the imaging apparatus. For convenience of description, a coordinate system is defined as illustrated in FIG. 1. A Z-axis is defined as a front-back direction (the direction of the front side as the front lens side is a +Z-direction, and the direction of the back side is a −Z-direction) of the imaging apparatus. A Y-axis is defined as a vertical direction (the direction of the upper side is a +Y-direction, and the direction of the lower side is a −Y-direction) of the imaging apparatus. An X-axis is defined as a lateral direction (the direction of the right side surface side as viewed from the front is a +X-direction, and the direction of the left side surface side is a −X-direction) of the imaging apparatus.

A one-dot chain line illustrated in FIG. 1 indicates an optical axis 1706. That is, the Z-direction corresponds to the optical axis direction. The imaging apparatus according to the present exemplary embodiment is an interchangeable lens imaging apparatus and will hereinafter be referred to as the "imaging apparatus".

As illustrated in FIGS. 1 and 2, a housing forming an apparatus main body of an imaging apparatus 1000 includes six basic surfaces (a front surface, a back surface, an upper surface, a lower surface, a left side surface, and a right side surface) and has a cuboid shape in which adjacent surfaces are approximately perpendicular to each other.

On the front surface side of the apparatus main body of the imaging apparatus 1000, a front cover 1004 is provided. The front cover 1004 includes an opening portion 1004*a* centered about the optical axis 1706. Inside the opening portion 1004*a*, a lens mount 1001 to which a lens device (lens barrel) 3000 (FIG. 5) is detachably attachable is provided. Further, a lens contact portion 1002 for communicating with the lens device 3000, and a lens detachment button 1003 for detaching the lens device 3000 are provided.

Inside the opening portion 1004*a* provided in the front cover 1004, an image sensor 1006 that converts an object optical image acquired by the lens device 3000 into an electric signal is provided.

Further, an upper side protruding portion 1100 and a lower side protruding portion 1101 protruding further to the lens device 3000 side (in the +Z-direction) than the lens mount 1001 are provided above and below the front cover 1004. The details of the protruding portions 1100 and 1101 will be described below.

On the left side surface side of the imaging apparatus 1000 as viewed from the front, a left side surface cover 1030 is provided. The left side surface cover 1030 includes a left side surface cover protruding portion 1031 protruding further than a left side surface cover first surface 1030*a*, which is a main surface of the left side surface cover 1030. In the left side surface cover protruding portion 1031, a plurality of air intake ports 1032 is formed that draws low-temperature air from outside the imaging apparatus 1000 into the imaging apparatus 1000 by the driving of fans 1404 (FIG. 4) placed inside the imaging apparatus 1000. The details of the left side surface cover protruding portion 1031 and the air intake ports 1032 will be described below.

In front upper and lower portions of the left side surface, tripod female threads 1700*g* and 1700*h* into which male threads can be inserted in a direction approximately parallel to the X-axis are provided. The details of the tripod female threads 1700*g* and 1700*h* will be described below.

On the right side surface side of the imaging apparatus 1000 as viewed from the front, a right side surface cover 1015 is provided. The right side surface cover 1015 includes a right side surface cover protruding portion 1016 protruding further than a right side surface cover first surface 1015*a*, which is a main surface of the right side surface cover 1015. In the right side surface cover protruding portion 1016, a plurality of air exhaust ports 1017 is formed that exhausts hot air generated inside the imaging apparatus 1000 to outside the imaging apparatus 1000 by the driving of the fans 1404 (FIG. 4) placed inside the imaging apparatus 1000. The details of the right side surface cover protruding portion 1016 and the air exhaust ports 1017 will be described below.

On the right side surface side of the imaging apparatus 1000 as viewed from the front, further, a REC button (recording start/end button) 1010 that is operated by a photographer, and operation keys 1011 for changing camera settings are provided. Further, a microphone unit 1012 that records voice, and a card storage cover 1013 that covers a storage chamber for storing a memory card, which is a recording medium, are provided.

In front upper and lower portions of the right side surface, tripod female threads 1700*e* and 1700*f* into which male threads can be inserted in a direction approximately parallel to the X-axis are provided. The details of the tripod female threads 1700*e* and 1700*f* will be described below.

On the upper surface side of the imaging apparatus 1000, a display unit 1040 that displays an image captured by the imaging apparatus 1000 or an image capturing setting menu, and operation keys 1041 for a user to change image capturing settings are provided. Further, tripod female threads 1700*a* to 1700*d* for fixing an external accessory, and electrical contacts 1043 for communicating with the external accessory are provided.

The external accessory is, for example, a display panel that displays a captured image or a recorded image, a handle unit into which a microphone terminal is built, or an external communication terminal such as a smartphone. If the external communication terminal such as a smartphone is connected to the imaging apparatus 1000, the user may set the image capturing menu of the imaging apparatus 1000 or give an image capturing instruction through the external communication terminal, and a captured image or a recorded image may be displayed on a display screen of the external communication terminal.

Electrical contacts (not illustrated) of the external accessory are connected to the electrical contacts 1043 of the imaging apparatus 1000, whereby it is possible to supply power or transmit and receive an electric signal between the external accessory and the imaging apparatus 1000. A configuration may be employed in which the external accessory and the imaging apparatus 1000 are connected together using not only a wired connection via the electrical contacts but also a wireless local area network (LAN) based on Wireless Fidelity (Wi-Fi) (registered trademark) or a wireless communication function provided in the smartphone. For example, a mobile phone line based on the fourth generation mobile communication system or the fifth generation mobile communication system may be used. Further, a configuration may be employed in which the imaging apparatus 1000 wirelessly communicates with outside via the external accessory.

A configuration may be employed in which the display unit 1040 is joined to the imaging apparatus 1000 by a rotating hinge so that the viewing angle of the display unit 1040 to the imaging apparatus 1000 can be changed. A configuration may be employed in which a touch panel is provided on the surface of the display unit 1040, and a menu is directly set by operating the touch panel.

On the back surface side of the imaging apparatus 1000, battery storage portions 1020 that store batteries 1070, and an external input/output terminals 1021 including an external connection terminal and a power supply terminal are provided. The battery storage portions 1020 are placed in two places one above the other, whereby, even in a case where one of the batteries 1070 runs out, the other battery 1070 can feed power. Thus, it is possible to continuously use the camera by replacing the battery without turning off the camera.

On the lower surface side of the imaging apparatus 1000, a tripod thread portion 1050 for fixing the imaging apparatus 1000 to a tripod is provided.

<Internal Configuration of Imaging Apparatus>

Figure 3:
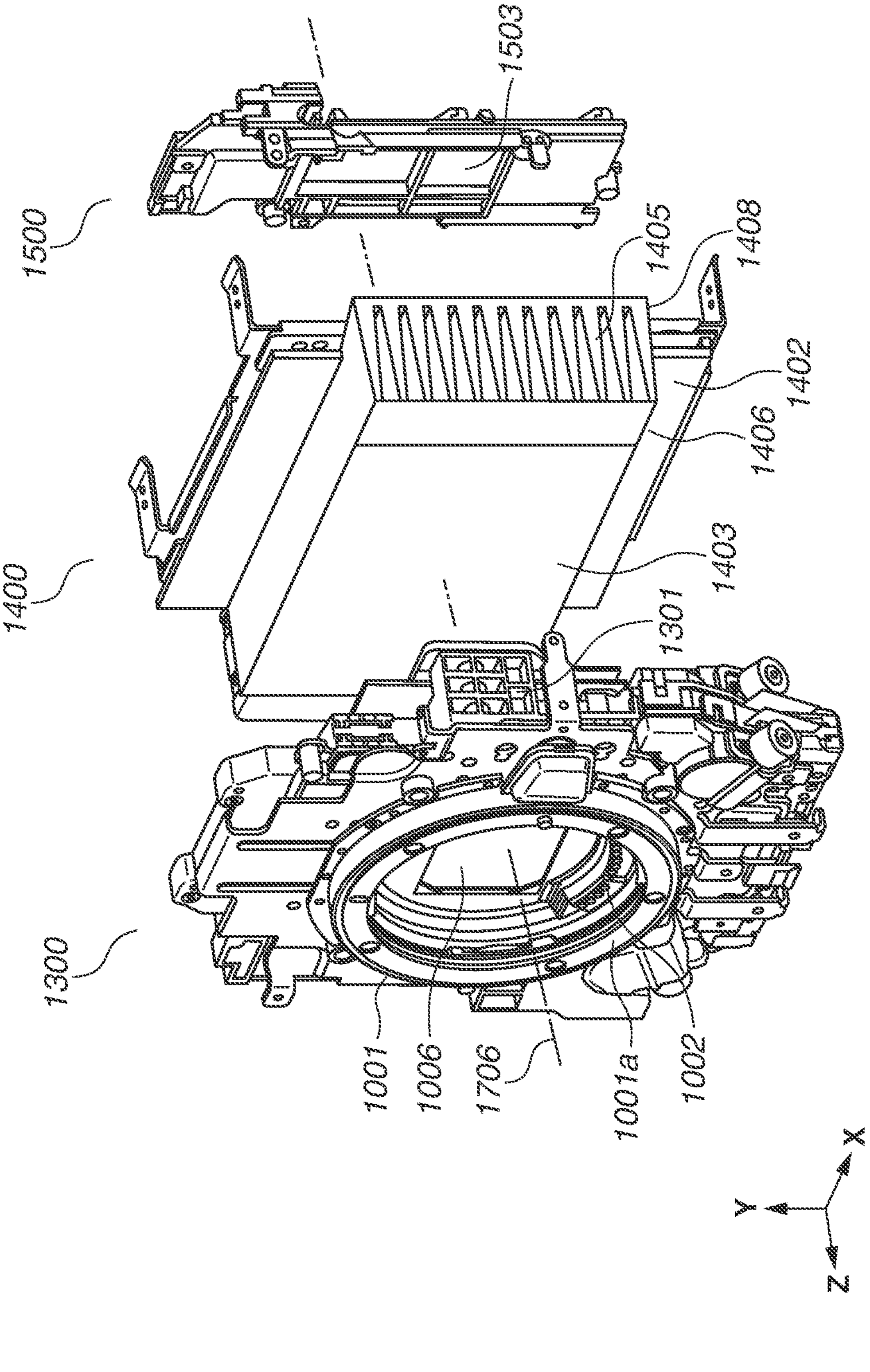
FIG. 3 is a front exploded perspective view illustrating internal main components of the imaging apparatus according to the first exemplary embodiment.
Figure 4:
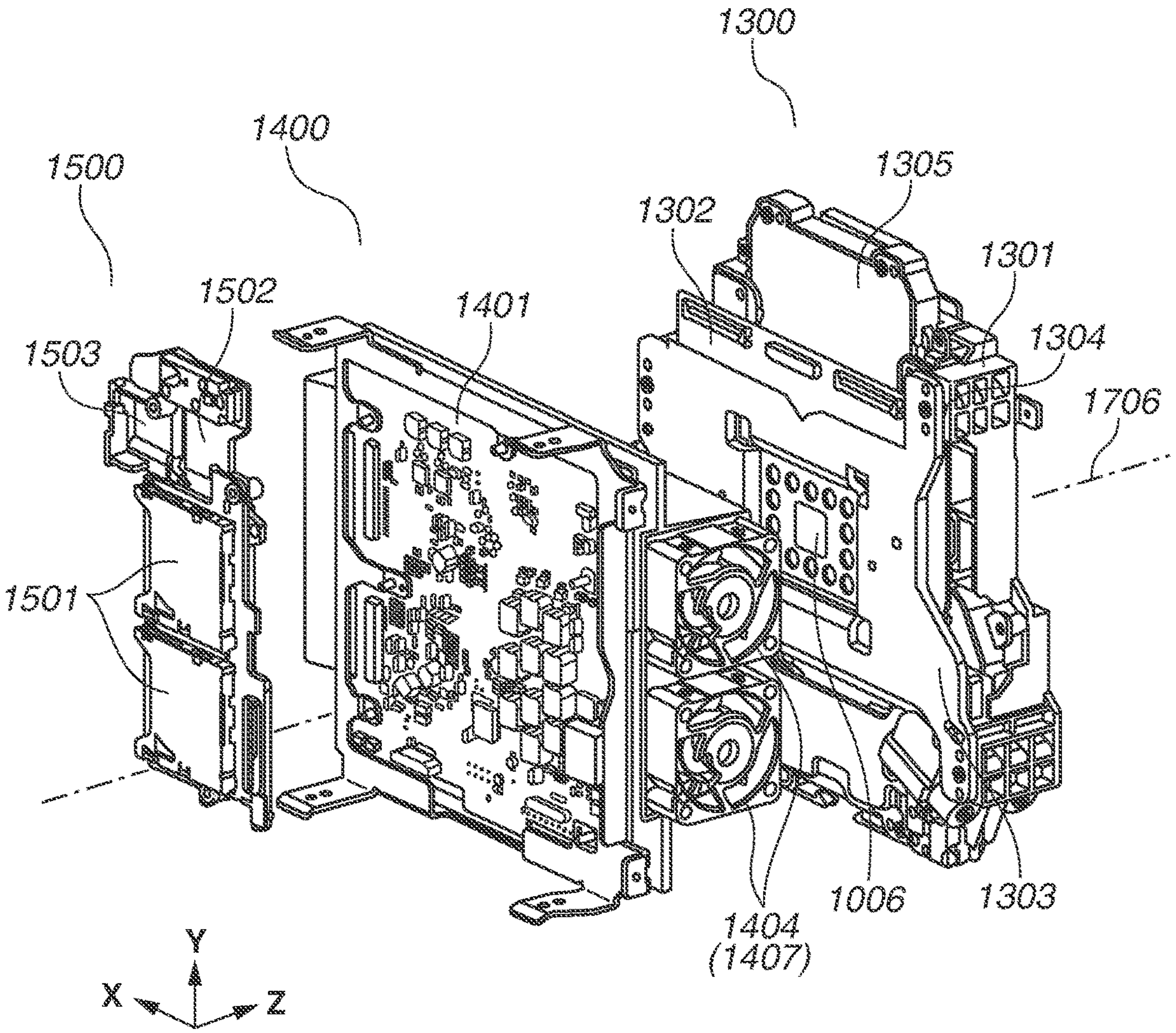
FIG. 4 is a rear exploded perspective view illustrating the internal main components of the imaging apparatus according to the first exemplary embodiment.

Next, the internal configuration of the imaging apparatus 1000 will be described. FIG. 3 is a front exploded perspective view of the internal main components of the imaging apparatus 1000. FIG. 4 is a rear exploded perspective view of the internal main components of the imaging apparatus 1000.

As illustrated in FIGS. 3 and 4, the inside of the imaging apparatus 1000 is broadly divided into an imaging unit 1300, a main unit 1400, and a card unit 1500. These units are placed along the optical axis 1706 (the Z-axis) in the above order from the front side.

The imaging unit 1300 includes an image sensor holding member 1301 that holds the lens mount 1001 and the image sensor 1006. The image sensor 1006 is electrically connected to an image sensor substrate 1302 by soldering.

The image sensor 1006 is mechanically fixed to an image sensor holding plate 1303 with an adhesive. The image sensor holding plate 1303 is fixed to the image sensor holding member 1301 with screws. The image sensor 1006, the image sensor substrate 1302, and the image sensor holding plate 1303 are placed perpendicular to the optical axis 1706 in the above order from the front side.

Similarly, the lens mount 1001 is also fixed to the image sensor holding member 1301 with screws. The distance from a mount surface 1001*a* of the lens mount 1001 to an imaging surface 1006*a* (see FIG. 9) of the image sensor 1006 is the flange focal distance of the imaging apparatus 1000. An internal adjustment washer 1304 is sandwiched between the image sensor holding plate 1303 and the image sensor holding member 1301. The thickness of the internal adjustment washer 1304 is adjusted so that the imaging apparatus 1000 has a predetermined flange focal distance when assembled.

It is desirable that the flange focal distance should be set to 20 mm or less, and the inner diameter of the lens mount 1001 should be set to 45 mm or more. For example, the flange focal distance is set to 20 mm, and the inner diameter of the mount 1001 is set to 54 mm. The lens contact portion 1002 for communicating with the lens device 3000 includes, for example, a 12-pin electronic contact.

Between the lens mount 1001 and the image sensor 1006, a neutral density (ND) unit 1305 is provided and fixed to the image sensor holding member 1301 with screws. The ND unit 1305 includes a plurality of ND filters (not illustrated) having different densities as optical components. The ND filters reduce incident light, whereby it is possible to decrease the shutter speed or open the diaphragm of the lens device 3000 when capturing an image.

An image signal output from the image sensor substrate 1302, a lens communication signal from the lens device 3000 connected to the lens contact portion 1002, and a control signal for the ND unit 1305 are transmitted to a main substrate 1401 of the main unit 1400 by internal wiring (not illustrated) such as a wire.

The main unit 1400 includes the main substrate 1401 that controls the operation of the imaging apparatus 1000, a heat sink 1402 thermally connected to the main substrate 1401, a heat dissipation plate 1403 that covers the heat sink 1402, and fans 1404 that send air into the heat sink 1402. The heat dissipation plate 1403, the heat sink 1402, and the main substrate 1401 are placed perpendicular to the optical axis 1706 in the above order from the front side. That is, the main substrate 1401 is placed parallel to the image sensor substrate 1302.

The heat sink 1402 is molded by aluminum die casting, which has excellent heat conductivity. The main substrate 1401 is fixed with screws in the state where an integrated circuit (IC) chip mounted on the substrate and acting as a heat source is thermally connected to the heat sink 1402 via a heat transfer member such as heat dissipation rubber or grease (not illustrated). To diffuse heat transferred from the main substrate 1401, which is the main heat source of the imaging apparatus 1000, it is desirable that the heat sink 1402 should have as large a surface area as possible. In the present exemplary embodiment, the main substrate 1401 and the heat sink 1402 have approximately the same outer shapes when projected.

The heat sink 1402 also includes a plurality of heat dissipation fins 1405 protruding in parallel on the opposite side of a surface of the heat sink 1402 that is opposed to the main substrate 1401. The heat dissipation fins 1405 extend in the lateral direction of the imaging apparatus 1000. The heat dissipation plate 1403 is fixed to the heat sink 1402 with screws to cover the heat dissipation fins 1405, whereby the heat dissipation plate 1403 and the heat sink 1402 form a ventilation duct unit 1406 in which air flows among the plurality of heat dissipation fins 1405.

The heat dissipation plate 1403 is formed into an L-shape that abuts a surface of the ventilation duct unit 1406 that is orthogonal to the heat dissipation fins 1405. The fans 1404 are fixed to a surface of the L-shaped heat dissipation plate 1403 (in the present exemplary embodiment, the left side surface of the imaging apparatus 1000) that is orthogonal to the main substrate 1401 and the heat dissipation fins 1405. The fans 1404 are axial flow fans, and draw in air from a surface direction and exhaust the air in a surface direction.

In the present exemplary embodiment, the two fans 1404 are placed one above the other in the vertical direction on the left side of the imaging apparatus 1000 and exhaust air to a side surface of the heat dissipation fins 1405. That is, the fans 1404 placed in an inlet portion of the ventilation duct unit 1406 serve as an air intake portion 1407, draw in cool air, and exhaust the cool air to the heat dissipation fins 1405 to which heat is transferred from the heat source of the main substrate 1401. By drawing in and exhausting air in such a manner, it is possible to exhaust hot air resulting from heat exchange with the heat dissipation fins 1405 to an opening end on the opposite side. The opening end on the opposite side serves as an air exhaust portion 1408.

The air intake portion 1407 of the ventilation duct unit 1406 is connected to the air intake ports 1032 of the imaging apparatus 1000, and the air exhaust portion 1408 of the ventilation duct unit 1406 is connected to the air exhaust ports 1017 of the imaging apparatus 1000. That is, the fans 1404 (the air intake portion 1407) are connected to the air intake ports 1032 of the imaging apparatus 1000, whereby it is possible to draw cool air from outside the imaging apparatus 1000 into the imaging apparatus 1000. The air exhaust portion 1408 is connected to the air exhaust ports 1017 of the imaging apparatus 1000, whereby it is possible to exhaust hot air from inside the imaging apparatus 1000 to outside the imaging apparatus 1000. The details of the above internal forced air cooling mechanism will be described below.

The card unit 1500 includes a card substrate 1502 on which card sockets 1501 are mounted, and a card substrate holding member 1503 that holds the card substrate 1502. In the present exemplary embodiment, the two card sockets 1501 are mounted on the card substrate 1502, whereby it is possible to perform simultaneous recording for backup and relay recording for long-duration recording.

The card substrate holding member 1503, the card substrate 1502, and the card sockets 1501 are placed perpendicular to the optical axis 1706 in the above order from the front side. That is, the card substrate 1502 is placed parallel to the main substrate 1401 and the image sensor substrate 1302. The card substrate 1502 is connected to the main substrate 1401 by internal wiring (not illustrated) such as a wire, and video data is recorded in a memory card attached to each of the card sockets 1501.

As described above, the image sensor substrate 1302, the main substrate 1401, and the card substrate 1502 that require relatively large areas are placed parallel to each other along the optical axis 1706, whereby it is possible to efficiently place the three substrates in the imaging apparatus 1000 and contribute to the downsizing of the imaging apparatus 1000. Further, the ventilation duct unit 1406 is placed parallel to the main substrate 1401, which is the main heat source, whereby it is possible to diffuse the heat of the main substrate 1401 in a wide range and exhaust the heat using the fans 1404. A structure may be employed in which the heat of the image sensor substrate 1302 or the card substrate 1502 is also transferred to and dissipated by the ventilation duct unit 1406.

<Configuration Block Diagram of Imaging Apparatus>

Figure 15:
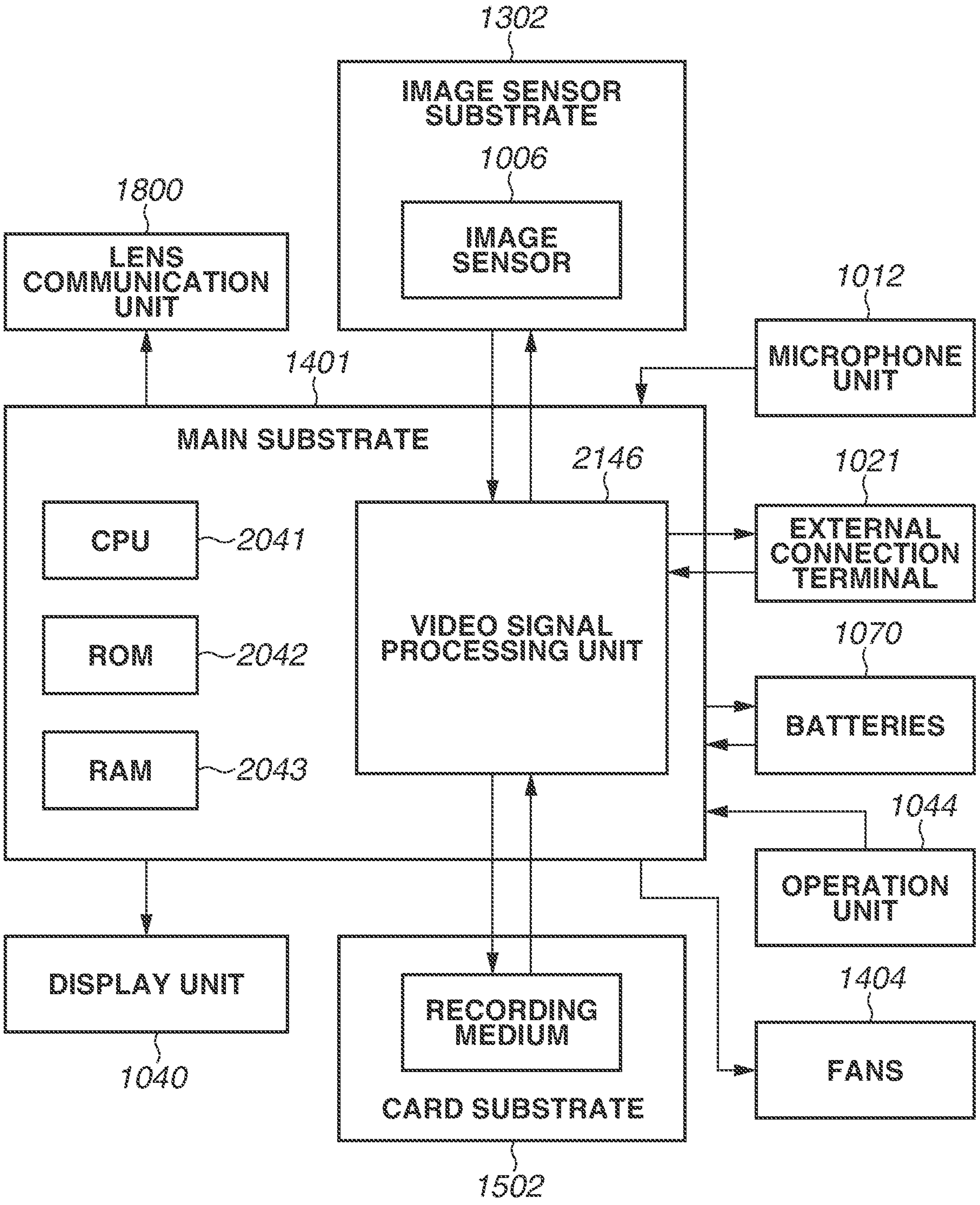
FIG. 15 is a block diagram illustrating a general configuration of the imaging apparatus according to the first exemplary embodiment.

FIG. 15 is a block diagram illustrating the general configuration of the imaging apparatus 1000. The functional configuration of the imaging apparatus 1000 will be described with reference to FIG. 15.

The imaging apparatus 1000 includes a lens communication unit 1800, the image sensor 1006 mounted on the sensor substrate 1302, the main substrate 1401, the card substrate 1502, and the microphone unit 1012. Further, the imaging apparatus 1000 includes the external input/output terminals 1021, the attachable and detachable batteries 1070, an operation unit 1044, the fans 1404, and the display unit 1040. A central processing unit (CPU) 2041, a read-only memory (ROM) 2042, and a random-access memory (RAM) 2043 are mounted on the main substrate 1401.

The ROM 2042 is an electrically erasable and recordable memory. As the ROM 2042, for example, an Electrically Erasable Programmable Read-Only Memory (EEPROM) is used. The ROM 2042 stores a constant for the operation of the CPU 2041 and a program. The CPU 2041 executes a program stored in the ROM 2042, thereby controlling the operations of the components included in the imaging apparatus 1000. This achieves overall control of the imaging apparatus 1000.

The RAM 2043 is used as a system memory, a work memory, an image memory, and a sound memory. A constant and a variable for the operation of the CPU 2041 and a program read from the ROM 2042 are loaded into the RAM 2043.

The image sensor 1006 is a charge-coupled device (CCD) sensor or a complementary metal-oxide-semiconductor (CMOS) sensor and includes an analog-to-digital (A/D) converter. The lens device 3000 attached to the imaging apparatus 1000 forms an optical image of incident light on the image sensor 1006. The image sensor 1006 converts the formed optical image into an analog electric signal, further causes the A/D converter to convert the analog electric signal into a digital signal, and outputs the digital signal as a video signal. The generated digital video signal is output to a video signal processing unit 2146 on the main substrate 1401.

The video signal processing unit 2146 performs predetermined processing on the input digital video signal and further combines the resulting signal with a separately introduced sound signal and various types of metadata, thereby generating video data. The video data generated by the video signal processing unit 2146 is sent to the display unit 1040 and displayed as a video on the display unit 1040. At this time, the operating state of the imaging apparatus 1000 is displayed as on-screen display information, where necessary.

The image sensor 1006 includes a plurality of phase difference detection pixels. The video signal processing unit 2146 can perform a correlation calculation using signals output from the plurality of phase difference detection pixels, and based on the result of the correlation calculation, control the focal position of the attached lens device 3000, thereby performing autofocus using an imaging plane phase difference detection method.

When the photographer selects recording, the video data generated by the video signal processing unit 2146 is subjected to predetermined processing, thereby being converted into various formats. Then, the video data is sent to the card substrate 1502 and saved as a video in a recording medium.

On the other hand, in a case where a predetermined connector is connected to the external connection terminal 1021, the video signal processing unit 2146 can output the video signal to the external connection terminal 1021, thereby transmitting the video signal to an external device.

The imaging apparatus 1000 can cause the video signal processing unit 2146 to read the recording data saved in the recording medium, thereby regenerating the original video data. Then, the regenerated video data can be output to the display unit 1040 or the external connection terminal 1021.

The gain of a sound signal input from the microphone unit 1012 is controlled to a predetermined level, and then, the sound signal is subjected to A/D conversion, thereby being converted into digital sound data. Video data and sound data are temporarily stored in the RAM 2043.

The CPU 2041 transmits the video data and the sound data temporarily stored in the RAM 2043 to the card substrate 1502. The recording medium can be inserted into and removed from the card substrate 1502, and the video data and the sound data are recorded in the recording medium. As the recording medium, a Secure Digital (SD) card or an attachable and detachable flash memory such as a memory card compliant with a standard such as CompactFlash (CF), CompactFast (CFast), XQD, or CFexpress is used.

The fans 1404 operate based on temperature acquired by a temperature detection unit (not illustrated), draw air into the imaging apparatus 1000, and exhaust the air. The rotation states of the fans 1404 are controlled by the CPU 2041.

The operation unit 1044 transmits an instruction given by an operation of the user to the CPU 2041. The operation unit 1044 includes the REC button 1010, a power switch, and the operation keys 1011 (see FIG. 1).

Various instructions from the user is transmitted to the CPU 2041 by operation of the operation unit 1044 by the user.

A power supply control unit (not illustrated) includes a battery detection circuit, a direct-current-to-direct-current (DC-DC) converter, and a switch circuit that switches a block to which to apply a current. The power supply control unit detects the presence or absence of attachment of a battery, the type of a battery, and the remaining life of a battery. For example, the batteries 1070 that supply power to the imaging apparatus 1000 are attachable to and detachable from the imaging apparatus 1000 and are lithium-ion batteries.

The display unit 1040 is, for example, a liquid crystal display device and displays the operating state of the imaging apparatus 1000 as on-screen display information, where necessary.

If the lens contact portion 1002 provided in the lens communication unit 1800 of the imaging apparatus 1000 and a lens contact portion on the lens device 3000 side (the details will be described below) come into contact and become conductive with each other, the CPU 2041 of the imaging apparatus 1000 detects the attachment of the lens device 3000. If detecting the attachment of the lens device 3000, the CPU 2041 reads lens information from a built-in memory of the lens device 3000 and stores the lens information in the RAM 2043. The details will be described below.

In the imaging apparatus 1000 according to the present exemplary embodiment, for example, light received by the image sensor 1006 is converted into digital image data of at least approximately 23 frames/second (fps), and the digital image data is recorded in the recording medium by the card substrate 1502. The frame rate can be set in the range of approximately 1 to 250 fps or more. For example, the imaging apparatus 1000 may change the frame rate according to the set resolution.

That is, in a "5K" resolution mode, the frame rate is set to approximately 1 to 100 fps. In a "4K" resolution mode, the frame rate is set to approximately 1 to 125 fps. In a quad high definition (QHD) mode, the frame rate is set to approximately 1 to 125 fps. In a "3K" resolution mode, the frame rate is set to approximately 1 to 160 fps. In a "2K" resolution mode, the frame rate is set to approximately 1 to 250 fps. For example, the frame rate may be set to 20, 23.976, 24, 30, 60, or 120 frames/second, or another frame rate between these frame rates, or a frame rate greater than or equal to these frame rates.

The imaging apparatus 1000 can output image data with a "2K" resolution (e.g., 16:9 (2048×1152 pixels) or 2:1 (2048×1024 pixels)) or a "3K" resolution (e.g., 16:9 (3072×1728 pixels) or 2:1 (3072×1536 pixels)). The imaging apparatus 1000 can also output image data with a "4K" resolution (e.g., 4096×2540 pixels, 16:9 (4096×2304 pixels), or 2:1 (4096×2048 pixels)) or a "4.5K" horizontal resolution.

The imaging apparatus 1000 can also output image data based on QHD (e.g., 3840×2160 pixels) or with a "5K" horizontal resolution (e.g., 5120×2700), a "6K" resolution (e.g., 6144×3160), or an "8K" resolution (e.g., 7680×4320). Further, the imaging apparatus 1000 can output image data with a resolution greater than or equal to these resolutions. The imaging apparatus 1000 can be configured to record or output image data having at least a horizontal resolution between any of the above resolutions.

Further, the resolution is at least one value between the above values (or any value between the above values), and can take approximately 6.5K, 7K, 8K, 9K, or 10K, or any value between these values. In the present exemplary embodiment, in a term represented in an xK format (2K, 4K, and the like), the number of "x" refers to an approximate horizontal resolution. A "4K" resolution corresponds to approximately 4000 or more horizontal pixels. A "2K" resolution corresponds to approximately 2000 or more horizontal pixels.

The image sensor 1006 can be in the range from approximately 0.5 inches (8 mm), ⅔ inches, the S35 format for movies, 35 mm full-frame still, to the 645 format, and can be at least approximately 1.0 inch or 6×17 cm or more. The image sensor 1006 can also have a size of at least approximately 10.1×5.35 mm, 24.4×13.7 mm, 30×15 mm, 36×24 mm, 56×42 mm, or 186×56 mm.

Additionally, the image sensor 1006 can be configured to selectively output only a predetermined portion of a pixel region, thereby providing a variable resolution. The image sensor 1006 can include, for example, color filters in the Bayer arrangement. Thus, the image sensor 1006 outputs data indicating the amount of red light, green light, or blue light detected by an individual photoelectric conversion element of the image sensor 1006.

<Detailed Configuration of Mount>

Figure 16B:
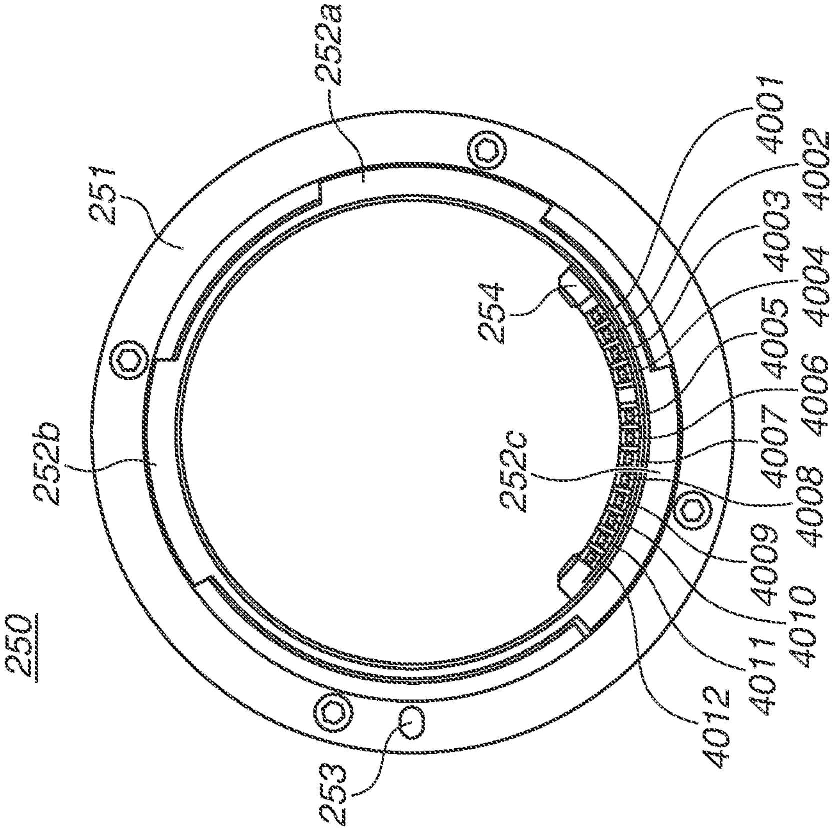
FIGS. 16A and 16B are schematic diagrams of mounts of the imaging apparatus according to the first exemplary embodiment and the lens device.
Figure 16A:
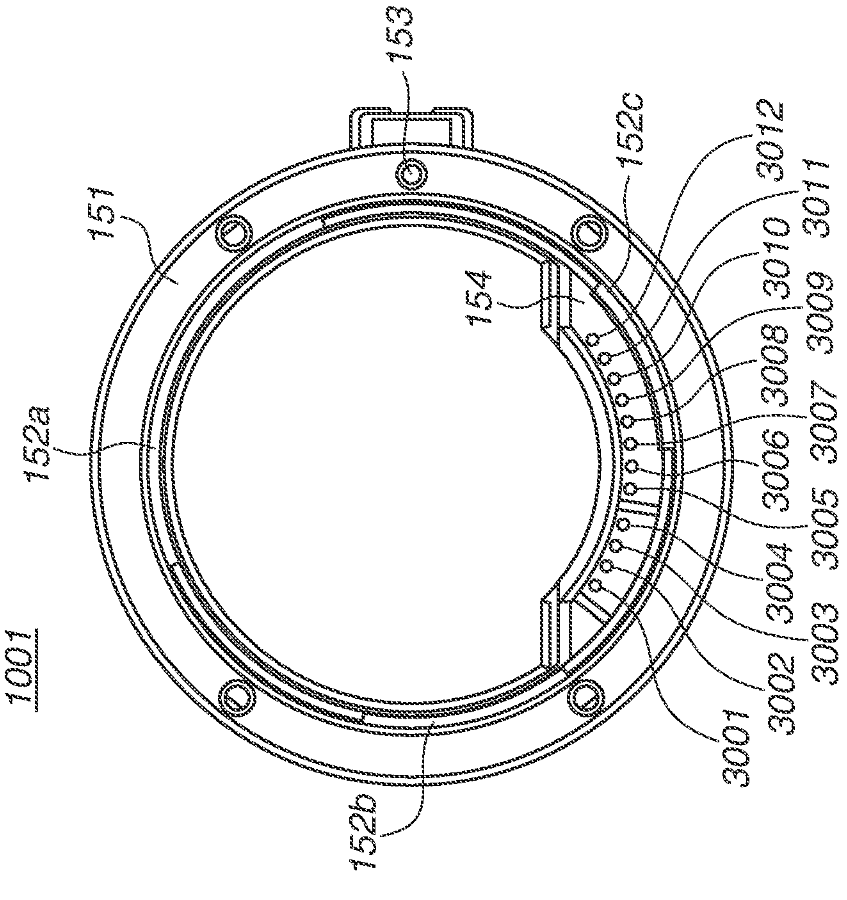

Next, the detailed configurations of mounts of the imaging apparatus 1000 and the lens device 3000 will be described with reference to FIGS. 16A and 16B. FIG. 16A is a schematic diagram of the lens mount 1001 of the imaging apparatus 1000 as viewed from the object side. FIG. 16B is a schematic diagram of a mount 250 of the lens device 3000 as viewed from the image plane side.

The lens mount 1001 is provided on the front side (the object side) of the imaging apparatus 1000. The lens mount 1001 includes a ring-shaped mount reference surface 151 for ensuring the predetermined flange focal distance. Inside the mount reference surface 151, bayonet claws 152*a* to 152*c* are provided in three places in the circumferential direction of the mount reference surface 151.

In the lens mount 1001, a lock pin 153 for positioning the mount 250 of the lens device 3000 when the mount 250 is bayonet-coupled to the lens mount 1001 is provided so that the lock pin 153 can protrude and retract relative to the mount reference surface 151. If the lens mount 1001 and the mount 250 of the lens device 3000 rotate relative to each other to the position where the attachment of the lens device 3000 is completed, a fitting hole 253 provided in the mount 250 of the lens device 3000 and the lock pin 153 engage with each other.

In a region inside the bayonet claws 152*a* to 152*c*, a camera-side contact holding unit 154 is provided. The camera-side contact holding unit 154 holds electrical contacts (camera-side electrical contacts) 3001 to 3012.

The mount 250 is fixed to a back end portion (the image plane side) of the lens device 3000. The mount 250 includes a ring-shaped mount reference surface 251, which is a reference surface for the flange focal distance. Inside the mount reference surface 251, bayonet claws 252*a* to 252*c* are provided in three places in the circumferential direction of the mount reference surface 251. The fitting hole 253 is provided in the mount 250. When the attachment of the lens device 3000 to the imaging apparatus 1000 is completed, the fitting hole 253 engages with the lock pin 153.

In a region inside the bayonet claws 252*a* to 252*c*, an accessory-side contact holding unit 254 is provided. The accessory-side contact holding unit 254 holds electrical contacts (lens-side electrical contacts) 4001 to 4012.

Figure 17:
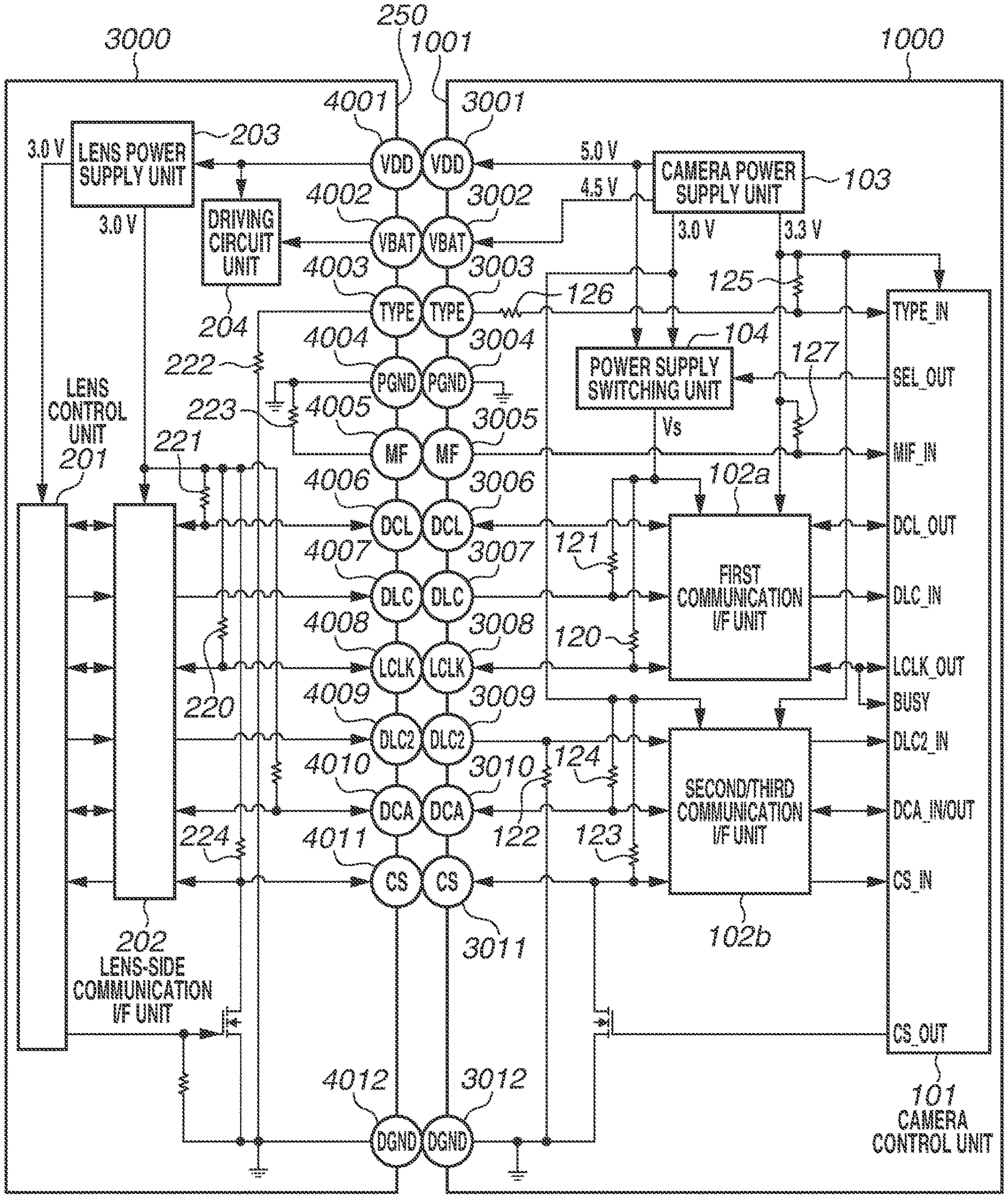
FIG. 17 is a block diagram illustrating a circuit configuration in a state where the lens device is connected to the imaging apparatus according to the first exemplary embodiment.

Next, FIG. 17 is a block diagram illustrating a circuit configuration in the state where the lens device 3000 is connected to the imaging apparatus 1000. The lens device 3000 and the imaging apparatus 1000 can communicate with each other via communication paths formed by some of the plurality of electrical contacts provided in the lens mount 1001 and the mount 250. The lens device 3000 and the imaging apparatus 1000 can perform first communication, second communication, and third communication.

A camera control unit 101 controls the output of each electrical contact provided in the lens mount 1001 and processes a signal input to the electrical contact, thereby controlling communication performed between the imaging apparatus 1000 and the lens device 3000 attached to the imaging apparatus 1000.

A camera power supply unit 103 is a power supply used for the operations of the components of the imaging apparatus 1000 and the lens device 3000 attached to the imaging apparatus 1000. The camera power supply unit 103 generates a plurality of different voltages and supplies power having the voltages to the components of the imaging apparatus 1000 or the lens device 3000 attached to the imaging apparatus 1000.

A power supply switching unit 104 supplies power to a first communication interface (I/F) unit 102*a*. To the power supply switching unit 104, power having two different voltage values is supplied from the power supply unit 103. Under control of the camera control unit 101, the power supply switching unit 104 can switch the power supplied to the first communication I/F unit 102*a*.

A lens control unit 201 controls the output of each electrical contact provided in the mount 250 and processes a signal input to the electrical contact, thereby controlling communication performed between the imaging apparatus 1000 and the lens device 3000.

A lens power supply unit 203 generates power having a predetermined voltage from power supplied from the imaging apparatus 1000 and supplies the generated power to the lens control unit 201 and a lens-side communication I/F unit 202.

The electrical contact 3001 and the electrical contact 4001 are terminals used to supply power (communication power) mainly used to control communication performed between the imaging apparatus 1000 and the lens device 3000, from the power supply unit 103 of the imaging apparatus 1000 to the lens device 3000.

Hereinafter, the electrical contact 3001 and the electrical contact 4001 will also be referred to as the "VDD terminal 3001" and the "VDD terminal 4001", respectively. In the present exemplary embodiment, the voltage of power supplied from the VDD terminal 3001 to the lens device 3000 (hereinafter referred to as the "VDD voltage") is 5.0 V.

The electrical contact (first camera-side electrical contact, also referred to as "first electrical contact") 3002 and the electrical contact 4002 are terminals used to supply power (driving power) mainly used for the operation of a driving system such as a motor, from the imaging apparatus 1000 to the lens device 3000. Hereinafter, the electrical contact 3002 and the electrical contact 4002 will also be referred to as the "VBAT terminal 3002" and the "VBAT terminal 4002", respectively.

In the present exemplary embodiment, the voltage of power supplied from the VBAT terminal 3002 to the lens device 3000 (hereinafter referred to as the "VBAT voltage") is 4.5 V. The VBAT voltage corresponds to a third voltage. The VDD terminals 3001 and 4001 and the VBAT terminals 3002 and 4002 are also collectively referred to as "power supply system terminals".

The electrical contact 3012 and the electrical contact 4012 are terminals for connecting one or more communication control system circuits of the imaging apparatus 1000 and the lens device 3000 to the ground (the ground level). That is, the electrical contacts 3012 and 4012 are ground terminals corresponding to the VDD terminals 3001 and 4001. Hereinafter, the electrical contact 3012 and the electrical contact 4012 will also be referred to as the "DGND terminal 3012" and the "DGND terminal 4012", respectively.

The electrical contact (second camera-side electrical contact, also referred to as "second electrical contact") 3004 and the electrical contact 4004 are terminals for connecting one or more driving system circuits including motors and provided in the imaging apparatus 1000 and the lens device 3000 to the ground (the ground level). That is, the electrical contacts 3004 and 4004 are ground terminals corresponding to the VBAT terminals 3002 and 4002. Hereinafter, the electrical contact 3004 and the electrical contact 4004 will also be referred to as the "PGND terminal 3004" and the "PGND terminal 4004", respectively. The DGND terminals 3012 and 4012 and the PGND terminals 3004 and 4004 will also be collectively referred to as "ground terminals".

The electrical contact 3005 and the electrical contact 4005 are terminals for detecting that the lens device 3000 is attached to the imaging apparatus 1000. According to the voltage level of the electrical contact 3005, the camera control unit 101 detects the attachment or detachment of the lens device 3000 to or from the imaging apparatus 1000. If the camera control unit 101 detects the attachment of the lens device 3000, the camera control unit 101 starts the supply of power to the lens device 3000 via the VDD terminal 3001 and the VBAT terminal 3002. Hereinafter, the electrical contact 3005 and the electrical contact 4005 will also be referred to as the "MIF terminal 3005" and the "MIF terminal 4005", respectively.

The electrical contact (third camera-side electrical contact, also referred to as "third electrical contact") 3003 and the electrical contact (first lens-side electrical contact, also referred to as "fourth electrical contact") 4003 are terminals for distinguishing the type of the lens device 3000 attached to the imaging apparatus 1000. In the imaging apparatus 1000, the electrical contact 3003 is pulled up via a resistor (first resistor) 125 to the same voltage as that of power supplied to the camera control unit 101.

In the lens device 3000, the electrical contact 4003 is pulled down to the ground (DGND) via a resistor 222. The resistor 222 has a resistance value determined in common among lens devices 3000 of the same type as the lens device 3000. Thus, the electrical contact 4003 connects to the electrical contact 3003 and thereby can change the voltage of the electrical contact 3003 to a voltage corresponding to the type of the lens device 3000.

The camera control unit 101 detects the voltage value of the electrical contact 3003, and based on the detected voltage value, distinguishes the type of the lens device 3000 attached to the imaging apparatus 1000. The camera control unit 101 controls the power supply switching unit 104 to switch the power supplied from the power supply switching unit 104 to the first communication I/F unit 102*a* according to the type of the lens device 3000 attached to the imaging apparatus 1000. This allows the imaging apparatus 1000 and the lens device 3000 attached to the imaging apparatus 1000 to communicate with each other at appropriate communication voltages. Hereinafter, the electrical contact 3003 and the electrical contact 4003 will also be referred to as the "TYPE terminal 3003" and the "TYPE terminal 4003", respectively.

The electrical contacts 3006 to 3008 and the electrical contacts 4006 to 4008 are terminals used for first communication. The inputs and outputs of the electrical contacts 3006 to 3008 are controlled by the camera control unit 101 via the first communication I/F unit 102*a*. The inputs and outputs of the electrical contacts 4006 to 4008 are controlled by the lens control unit 201 via the lens-side communication I/F unit 202.

The electrical contact 3008 and the electrical contact 4008 are terminals capable of outputting a clock pulse used for the first communication from the imaging apparatus 1000 to the lens device 3000. The electrical contact 3008 and the electrical contact 4008 are also used by the lens device 3000 to notify the imaging apparatus 1000 of a communication standby request. Hereinafter, the electrical contact 3008 and the electrical contact 4008 will also be referred to as the "LCLK terminal 3008" and the "LCLK terminal 4008", respectively.

In the imaging apparatus 1000, the LCLK terminal 3008 is pulled up to the same potential as the interface voltage of the first communication I/F unit 102*a* via a resistor 120. In the lens device 3000, the LCLK terminal 4008 is pulled up to the same potential as the interface voltage of the lens-side communication I/F unit 202 via a resistor 220.

The electrical contact 3006 and the electrical contact 4006 are terminals capable of transmitting data from the imaging apparatus 1000 to the lens device 3000 through the first communication. Hereinafter, the electrical contact 3006 and the electrical contact 4006 will also be referred to as the "DCL terminal 3006" and the "DCL terminal 4006", respectively. In the lens device 3000, the DCL terminal 4006 is pulled up to the same potential as the interface voltage of the lens-side communication I/F unit 202 via a resistor 221.

The electrical contact 3007 and the electrical contact 4007 are terminals capable of transmitting data from the lens device 3000 to the imaging apparatus 1000 through the first communication. Hereinafter, the electrical contact 3007 and the electrical contact 4007 will also be referred to as the "DLC terminal 3007" and the "DLC terminal 4007", respectively. In the imaging apparatus 1000, the DLC terminal 3007 is pulled up to the same potential as the interface voltage of the first communication I/F unit 102*a* via a resistor 121.

Hereinafter, the LCLK terminal 3008, the DCL terminal 3006, and the DLC terminal 3007 used for the first communication will also be referred to as a "first camera-side electrical contact group". The LCLK terminal 4008, the DCL terminal 4006, and the DLC terminal 4007 will also be referred to as a "first lens-side electrical contact group".

The electrical contact 3009 and the electrical contact 4009 are used for second communication. The electrical contact 3009 and the electrical contact 4009 are terminals capable of transmitting data from the lens device 3000 to the imaging apparatus 1000 through the second communication. Hereinafter, the electrical contact 3009 and the electrical contact 4009 will also be referred to as the "DLC2 terminal 3009" and the "DLC2 terminal 4009", respectively. In the imaging apparatus 1000, the DLC2 terminal 3009 is pulled down to the same potential as that of the DGND terminal 3012 via a resistor 122.

The electrical contacts 3010 and 3011 and the electrical contacts 4010 and 4011 are terminals used for third communication.

The electrical contact 3010 and the electrical contact 4010 are terminals capable of transmitting and receiving data in both directions between the imaging apparatus 1000 and the lens device 3000 through the third communication. Hereinafter, the electrical contact 3010 and the electrical contact 4010 will also be referred to as the "DCA terminal 3010" and the "DCA terminal 4010", respectively. In the imaging apparatus 1000, the DCA terminal 3010 is pulled up to the same potential as the interface voltage of a second/third communication I/F unit 102*b* via a resistor 124.

The DCA terminal 3010 is connected to the camera control unit 101 via a CMOS-type input/output interface. Similarly, the DCA terminal 4010 is connected to the lens control unit 201 via a CMOS-type input/output interface. This allows the camera control unit 101 and the lens control unit 201 to transmit and receive data at high speed using the DCA terminals 3010 and 4010.

The electrical contact 3011 and the electrical contact 4011 are terminals used by the imaging apparatus 1000 and the lens device 3000 to notify each other of a predetermined timing described below regarding the third communication. Hereinafter, the electrical contact 3011 and the electrical contact 4011 will also be referred to as the "CS terminal 3011" and the "CS terminal 4011", respectively. In the imaging apparatus 1000, the CS terminal 3011 is pulled up to the same potential as the interface voltage of the second/third communication I/F unit 102*b* via a resistor 123. In the lens device 3000, the CS terminal 4011 is pulled up to the same potential as the interface voltage of the lens-side communication I/F unit 202 via a resistor 224.

The CS terminal 3011 is connected to the camera control unit 101 via an open-type output interface. Similarly, the CS terminal 4011 is connected to the lens control unit 201 via an open-type output interface. An "open-type output interface" refers to an output interface that is an open drain or an open collector.

In the present exemplary embodiment, if the lens device 3000 is attached to the imaging apparatus 1000, the interface voltages of the first communication I/F unit 102*a* and the second/third communication I/F unit 102*b* are set to 3.0 V (a first voltage). The interface voltage of the lens-side communication I/F unit 202 is set to 3.0 V (the first voltage). Hereinafter, the LCLK terminals 3008 and 4008, the DCL terminals 3006 and 4006, the DLC terminals 3007 and 4007, the DLC2 terminals 3009 and 4009, the CS terminals 3011 and 4011, and the DCA terminals 3010 and 4010 will also be collectively referred to as "communication system terminals".

Next, a description will be given of communication performed between the lens device 3000 attached to the imaging apparatus 1000 and the imaging apparatus 1000.

First, first communication will be described. The first communication is one type of communication performed between the imaging apparatus 1000 and the lens device 3000 attached to the imaging apparatus 1000. The first communication is performed using the LCLK terminals 3008 and 4008, the DCL terminals 3006 and 4006, and the DLC terminals 3007 and 4007. The first communication is performed using a clock synchronization communication method. Alternatively, the first communication may be performed using an asynchronous communication method. In this case, the LCLK terminals 3008 and 4008 are used as terminals for the imaging apparatus 1000 to notify the lens device 3000 of a data transmission request.

The imaging apparatus 1000 transmits a control command for controlling the lens device 3000 to the lens device 3000 through the first communication. The control command includes a command to drive a driving unit (not illustrated) of the lens device 3000. Examples of the driving unit of the lens device 3000 can include a focus lens, a zoom lens, and diaphragm blades.

Receiving the control command transmitted through the first communication, the lens device 3000 performs an operation according to the command. In response to the control command, the lens device 3000 transmits information regarding the state of the lens device 3000 (state information) to the imaging apparatus 1000 through the first communication. The information regarding the state includes information regarding the position of the focus lens, the focal length, and the stop value.

As described above, the first communication is communication mainly used to control the lens device 3000.

Next, second communication will be described. The second communication is one type of communication performed between the imaging apparatus 1000 and the lens device 3000 attached to the imaging apparatus 1000 and is asynchronous communication performed using the DLC2 terminals 3009 and 4009.

In the second communication, the lens device 3000 as a communication master transmits optical data indicating the position of the focus lens, the position of the zoom lens, the stop value, and the state of an image stabilization lens in the lens device 3000 to the imaging apparatus 1000. The types and the order of data to be transmitted from the lens device 3000 to the imaging apparatus 1000 through the second communication are specified by the imaging apparatus 1000 through the first communication.

Figure 18:
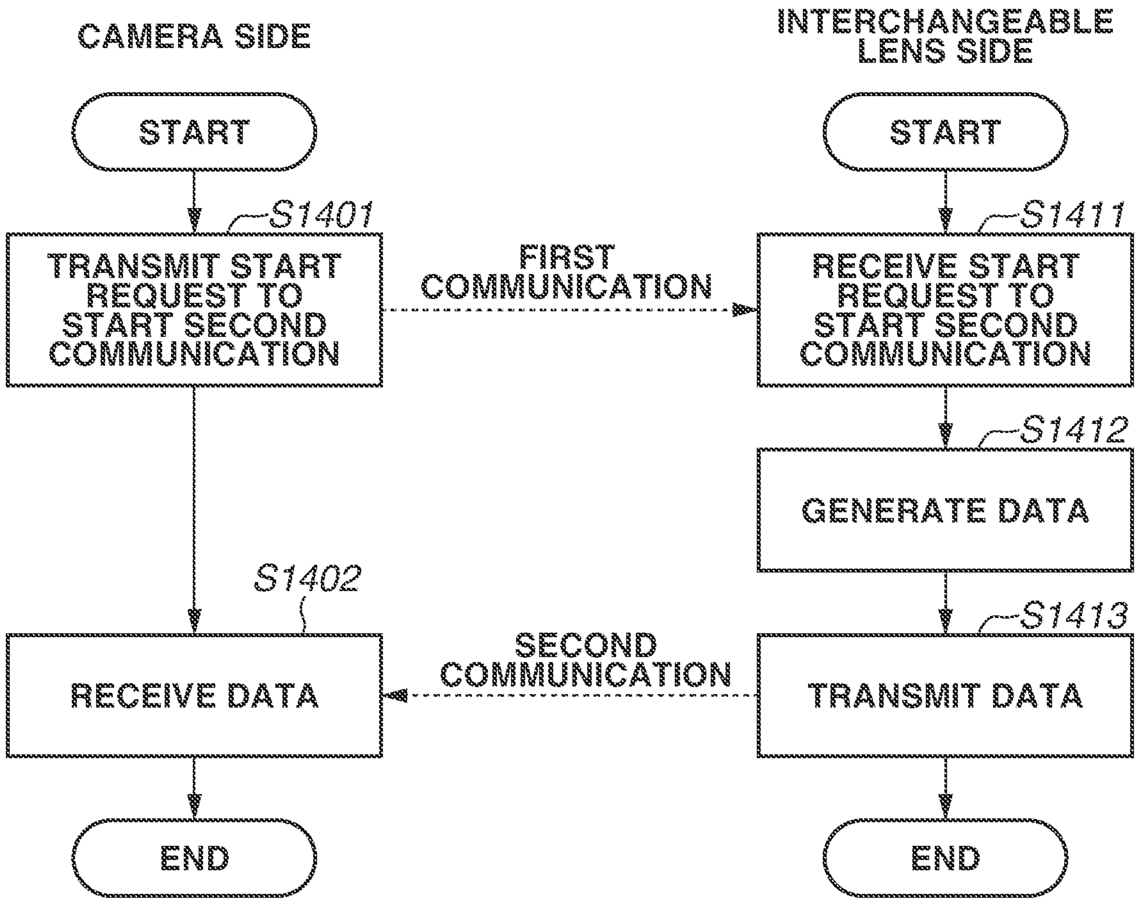
FIG. 18 is a flowchart illustrating a flow of second communication according to the first exemplary embodiment.

The flow of the second communication will be described with reference to FIG. 18. A flowchart in FIG. 18 is started at the timing when imaging control is started.

In step S1401, the imaging apparatus 1000 transmits a start request to start the second communication to the lens device 3000 through the first communication. The start request transmitted in step S1401 includes a registration communication command in which the type of data that the imaging apparatus 1000 should receive from the lens device 3000 through the second communication and the order of reception of data are registered in advance.

In step S1411, the lens device 3000 receives the start request from the imaging apparatus 1000. In step S1412, the lens device 3000 generates data of the type specified by the registration communication command included in the start request in the specified order.

In step S1413, the lens device 3000 transmits the data generated in step S1412 to the imaging apparatus 1000 through the second communication. That is, using the DLC2 terminal 4009, the lens device 3000 transmits the data generated in step S1412 to the imaging apparatus 1000.

In step S1402, the imaging apparatus 1000 receives the data transmitted from the lens device 3000 through the second communication.

If the imaging control is started again after step S1402 or S1413, the control illustrated in FIG. 18 is started again.

As described above, the start request to start the second communication is made through the first communication, and the transmission of the data from the lens device 3000 to the imaging apparatus 1000 through the second communication is performed using the DLC2 terminal 4009. Thus, the second communication is performed by providing the DLC2 terminal 4009 separately from the electrical contacts used for the first communication, whereby it is possible to transmit optical data from the lens device 3000 to the imaging apparatus 1000 without hindering another type of communication that needs to be performed through the first communication.

Since the start request to start the second communication is made through the first communication, the second communication cannot be performed in a case where the first communication is not established.

<Configurations of Front Side Protruding Portions>

Figure 5:
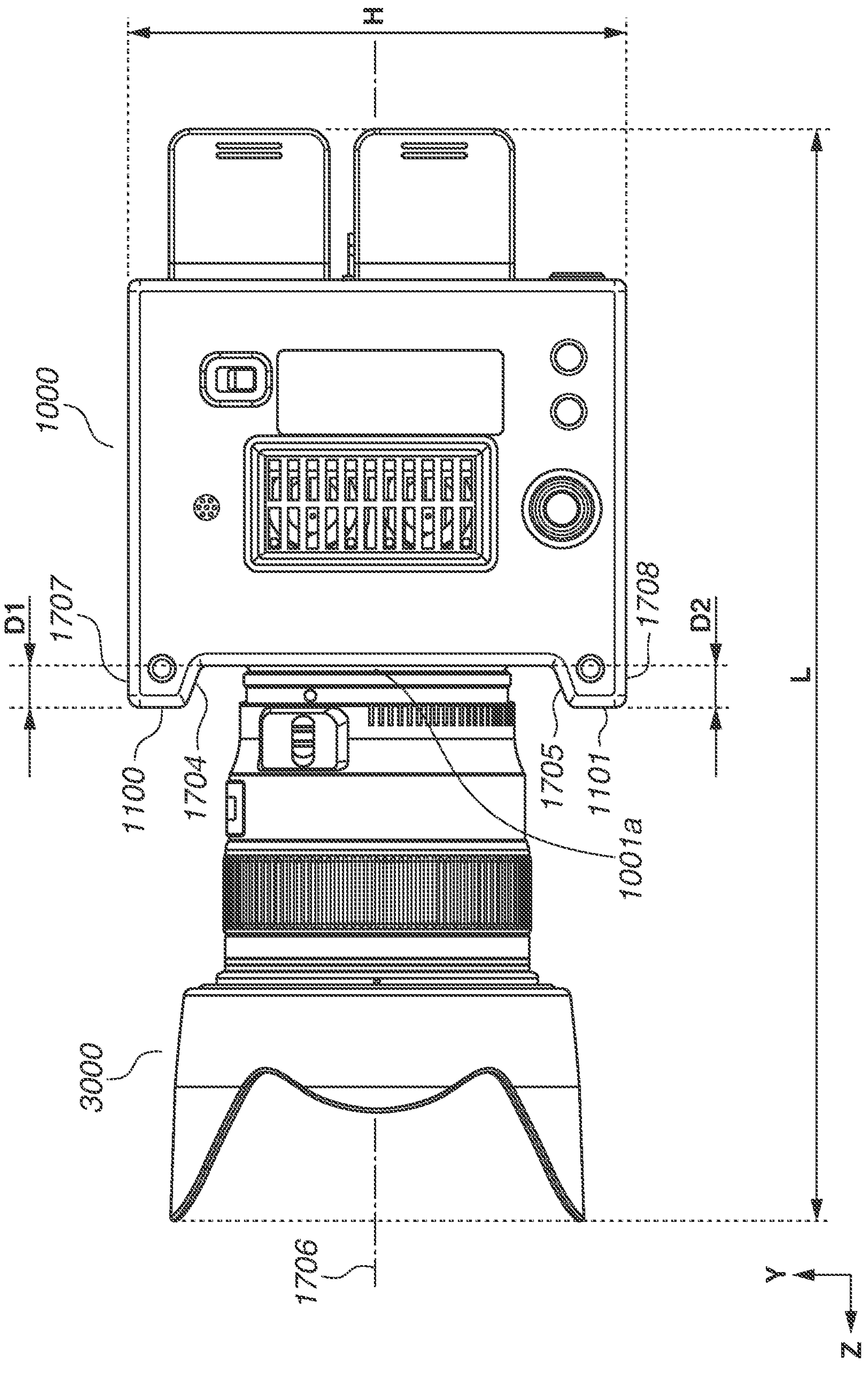
FIG. 5 is a right side view illustrating a state where a lens device is attached to the imaging apparatus according to the first exemplary embodiment.
Figure 6:
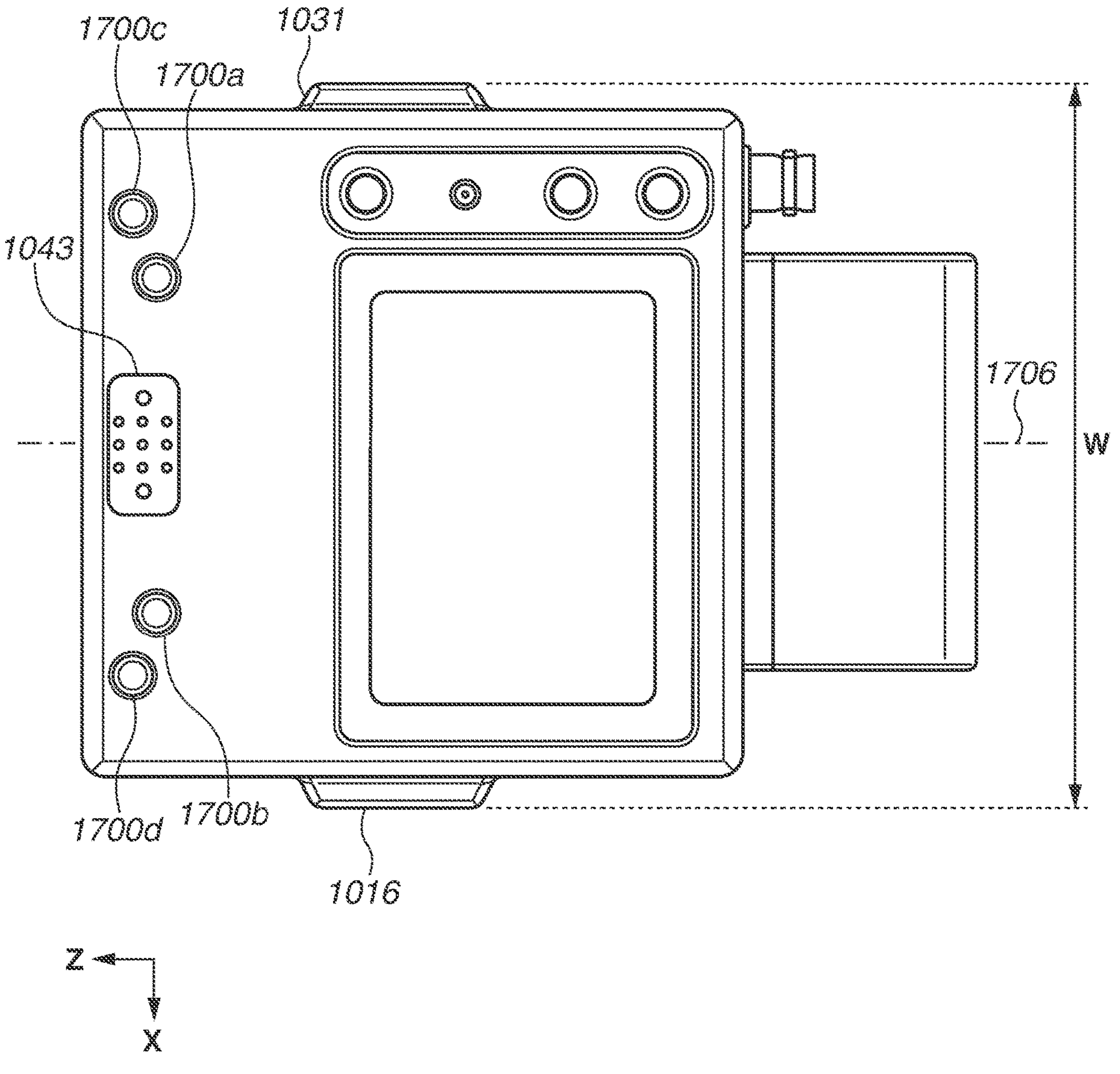
FIG. 6 is a top view illustrating the imaging apparatus according to the first exemplary embodiment.
Figure 7:
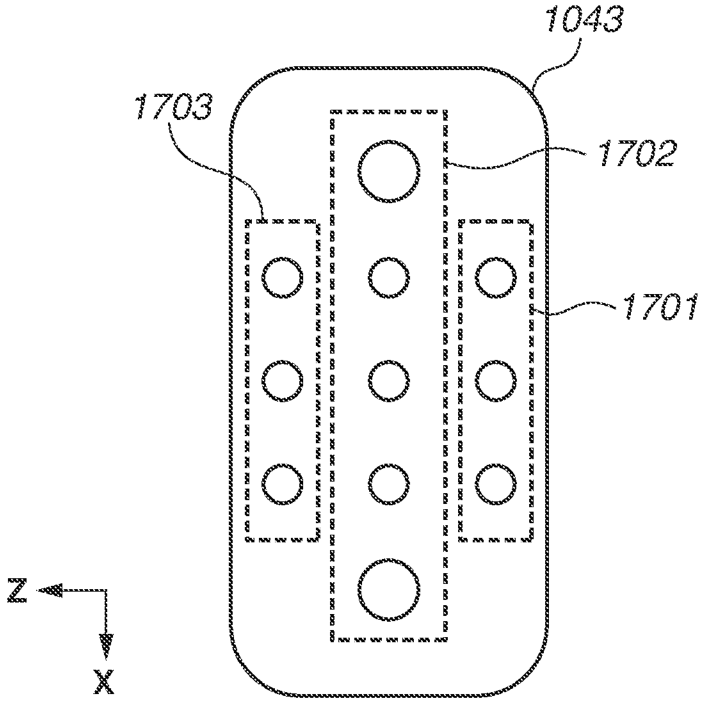
FIG. 7 is an enlarged top view of electrical contacts in FIG. 6.

Description will be given of the upper side protruding portion 1100 and the lower side protruding portion 1101 provided on the front surface of the imaging apparatus 1000 with reference to FIGS. 1, 2, and 5 to 7. FIG. 5 is a right side view in the state where the lens device 3000 is attached to the imaging apparatus 1000. FIG. 6 is a top view of the imaging apparatus 1000. FIG. 7 is an enlarged view of the electrical contacts 1043 in FIG. 6.

As illustrated in FIGS. 1 and 5, the upper side protruding portion 1100 and the lower side protruding portion 1101 are provided to sandwich the lens mount 1001 in the vertical direction of the imaging apparatus 1000. The upper side protruding portion 1100 and the lower side protruding portion 1101 protrude further than the mount surface 1001*a* in the direction of the optical axis 1706 (the +Z-direction).

As illustrated in FIG. 5, the upper side protruding portion 1100 is provided continuously from the upper surface (an upper flat surface) of the imaging apparatus 1000 and includes an upper surface (upper flat surface) 1707 approximately parallel to the optical axis 1706. Similarly, the lower side protruding portion 1101 is provided continuously from the lower surface (a lower flat surface) of the imaging apparatus 1000 and includes a lower surface (lower flat surface) 1708 approximately parallel to the optical axis 1706.

As described above, each of the upper surface 1707 of the upper side protruding portion 1100 and the lower surface 1708 of the lower side protruding portion 1101 is a surface approximately parallel to the optical axis 1706. Consequently, it is possible to improve balance by coming into contact with the ground in an area made wider by each protruding portion. Then, not only the capturing of an image by placing the lower surface of the imaging apparatus 1000 down on the ground, but also the capturing of an image by placing the upper surface of the imaging apparatus 1000 down on the ground can be performed in a stable state.

The upper side protruding portion 1100 and the lower side protruding portion 1101 are provided in such a manner, whereby, even when the imaging apparatus 1000 is placed on the ground with the mount surface 1001*a* down in the state where the lens device 3000 is detached from the imaging apparatus 1000, it is possible to protect the mount surface 1001*a*. That is, it is possible to prevent the mount surface 1001*a* from coming into contact with the ground.

Further, an amount of protrusion D1 in the Z-direction of the upper side protruding portion 1100 is approximately the same as an amount of protrusion D2 in the Z-direction of the lower side protruding portion 1101. The amounts of protrusion are thus approximately the same, whereby, in a case where the lens device 3000 is attached to the imaging apparatus 1000 and an image is captured by placing the lower surface of the imaging apparatus 1000 down on the ground, it is possible to prevent the imaging apparatus 1000 from falling over to the front side by the weight of the lens device 3000. Also in a case where an image is captured by placing the upper surface of the imaging apparatus 1000 down on the ground, it is possible to prevent the imaging apparatus 1000 from falling over to the front side by the weight of the lens device 3000.

As illustrated in FIG. 5, the upper side protruding portion 1100 includes a sloping portion 1704. The sloping portion 1704 is formed so that the thickness in the vertical direction (the ±Y-direction) of the upper side protruding portion 1100 becomes smaller toward the front direction (the +Z-direction) of the imaging apparatus 1000. That is, the sloping portion 1704 slopes in a direction away from the optical axis 1706 (the +Y-direction) toward the front direction (the +Z-direction) of the imaging apparatus 1000.

Similarly, the lower side protruding portion 1101 includes a sloping portion 1705. The sloping portion 1705 is formed so that the thickness in the vertical direction (the ±Y-direction) of the lower side protruding portion 1101 becomes smaller toward the front direction (the +Z-direction) of the imaging apparatus 1000. That is, the sloping portion 1705 slopes in a direction away from the optical axis 1706 (the −Y-direction) toward the front direction (the +Z-direction) of the imaging apparatus 1000.

The thicknesses in the vertical direction of the upper side protruding portion 1100 and the lower side protruding portion 1101 are set as described above, whereby it is possible to enhance the mechanical strengths of the upper side protruding portion 1100 and the lower side protruding portion 1101 in regions that do not interfere with the lens device 3000.

As illustrated in FIGS. 1 and 2, on the upper surface 1707 of the upper side protruding portion 1100, the tripod female threads 1700*a* to 1700*d* are provided so that male threads of an external accessory can be inserted into the tripod female threads 1700*a* to 1700*d* in a direction approximately parallel to the Y-axis, and the electrical contacts 1043 are also provided. Side surfaces (the right side surface cover first surface 1015*a* and the left side surface cover first surface 1030*a*) of the upper side protruding portion 1100 include the tripod female threads 1700*e* and 1700*g* provided so that male threads of an external accessory can be inserted into the tripod female threads 1700*e* and 1700*g* in a direction approximately parallel to the X-axis.

Side surfaces (the right side surface cover first surface 1015*a* and the left side surface cover first surface 1030*a*) of the lower side protruding portion 1101 include the tripod female threads 1700*f* and 1700*h* provided so that male threads of an external accessory can be inserted into the tripod female threads 1700*f* and 1700*h* in a direction approximately parallel to the X-axis. Various external accessories as described above can be attached to the tripod female threads 1700*a* to 1700*h*.

That is, the tripod female threads 1700*a* to 1700*h* and the electrical contacts 1043 can be provided in the imaging apparatus 1000 without making the outermost dimensions large in the state where the lens device 3000 is attached to the imaging apparatus 1000 as illustrated in FIG. 5. The outermost dimensions include an outermost dimension L in the front-back direction (a longitudinal direction), an outermost dimension H in the vertical direction (a height direction), and an outermost dimension W in the lateral direction (a width direction) of the imaging apparatus 1000 as illustrated in FIG. 6.

Further, in a case where a first external accessory (not illustrated) is attached by male threads provided in the first external accessory engaging with the tripod female threads 1700*a* and 1700*b*, an electrical contact portion of the first external accessory is electrically connected to a contact group 1701 and a contact group 1702 as illustrated in FIG. 7 in the electrical contacts 1043.

On the other hand, in a case where a second external accessory (not illustrated) is attached by male threads of the second external accessory by engaging with the tripod female threads 1700*c* and 1700*d*, an electrical contact portion of the second external accessory is electrically connected to the contact group 1702 and a contact group 1703 as illustrated in FIG. 7 in the electrical contacts 1043.

As described above, the contact group 1702 is common contacts between a case where the first external accessory is attached and a case where the second external accessory is attached. That is, it is possible to make an area for providing the tripod female threads 1700*a* to 1700*d* and the electrical contacts 1043 smaller in the optical axis direction than in a case where a dedicated contact group is provided for each of the first and second external accessories.

The present disclosure is not limited to a configuration as described above. That is, the present disclosure is not limited to a configuration in which an upper side protruding portion extending from an upper surface of an imaging apparatus to the front side in an optical axis direction and a lower side protruding portion extending from a lower surface of the imaging apparatus to the front side in the optical axis direction are provided.

For example, in addition to the upper side protruding portion 1100 and the lower side protruding portion 1101, further, a left side protruding portion extending from the left side of the imaging apparatus 1000 to the front side in the optical axis direction, and a right side protruding portion extending from the right side of the imaging apparatus 100 to the front side in the optical axis direction may be provided. In this case, a configuration may be employed in which the lengths in the X-direction (the lateral direction of the imaging apparatus 1000) of the upper side protruding portion 1100 and the lower side protruding portion 1101 are shorter than those described above in the present exemplary embodiment. Alternatively, a configuration may be employed in which the upper side protruding portion 1100 and the lower side protruding portion 1101 are not provided, and only the right side protruding portion and the left side protruding portion are provided. Yet alternatively, a configuration may be employed in which two or more of the upper side protruding portion 1100, the lower side protruding portion 1101, the left side protruding portion, and the right side protruding portion are provided.

<Configurations of Side Surface Side Protruding Portions>

Figure 8:
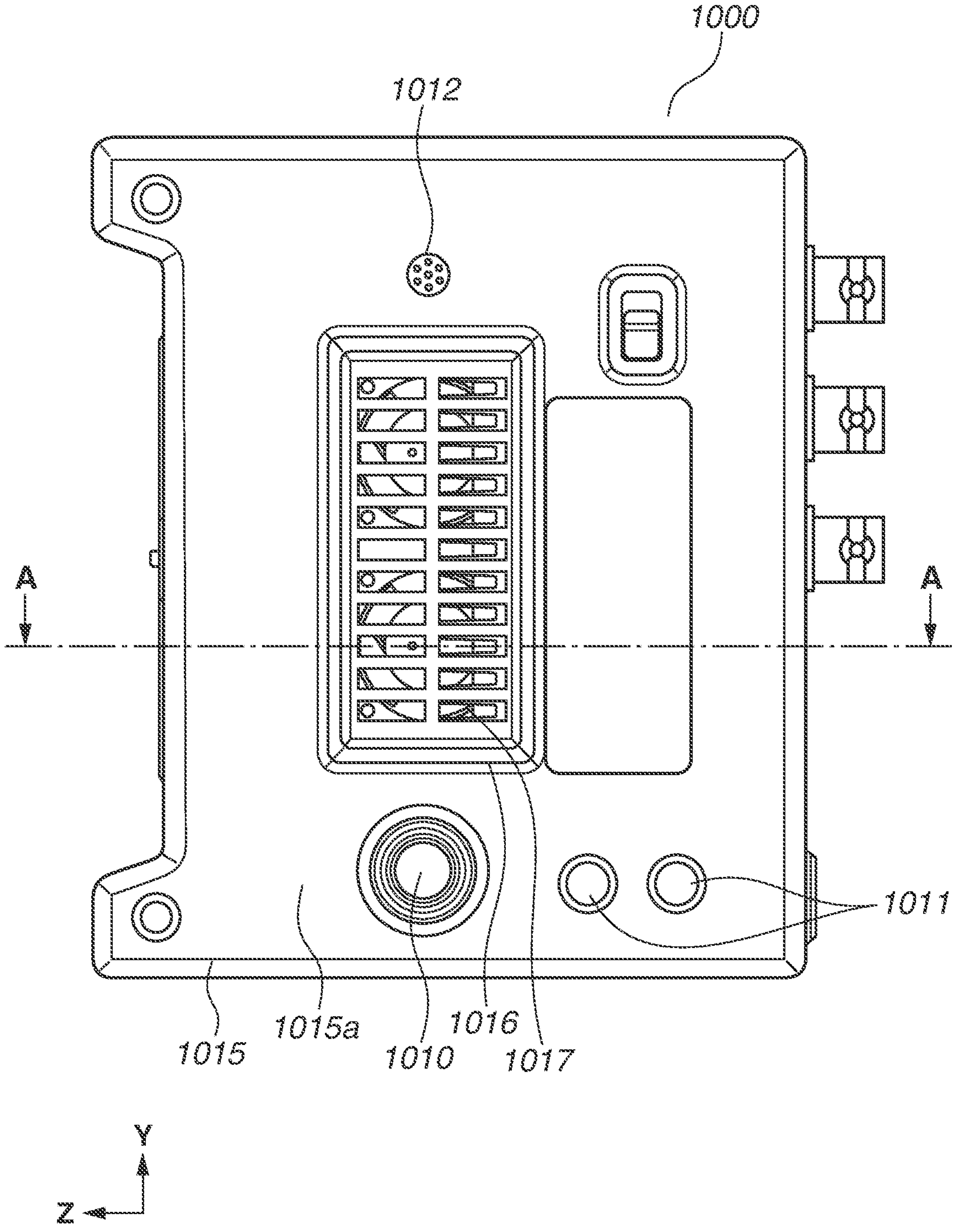
FIG. 8 is a right side view illustrating the imaging apparatus according to the first exemplary embodiment.
Figure 9:
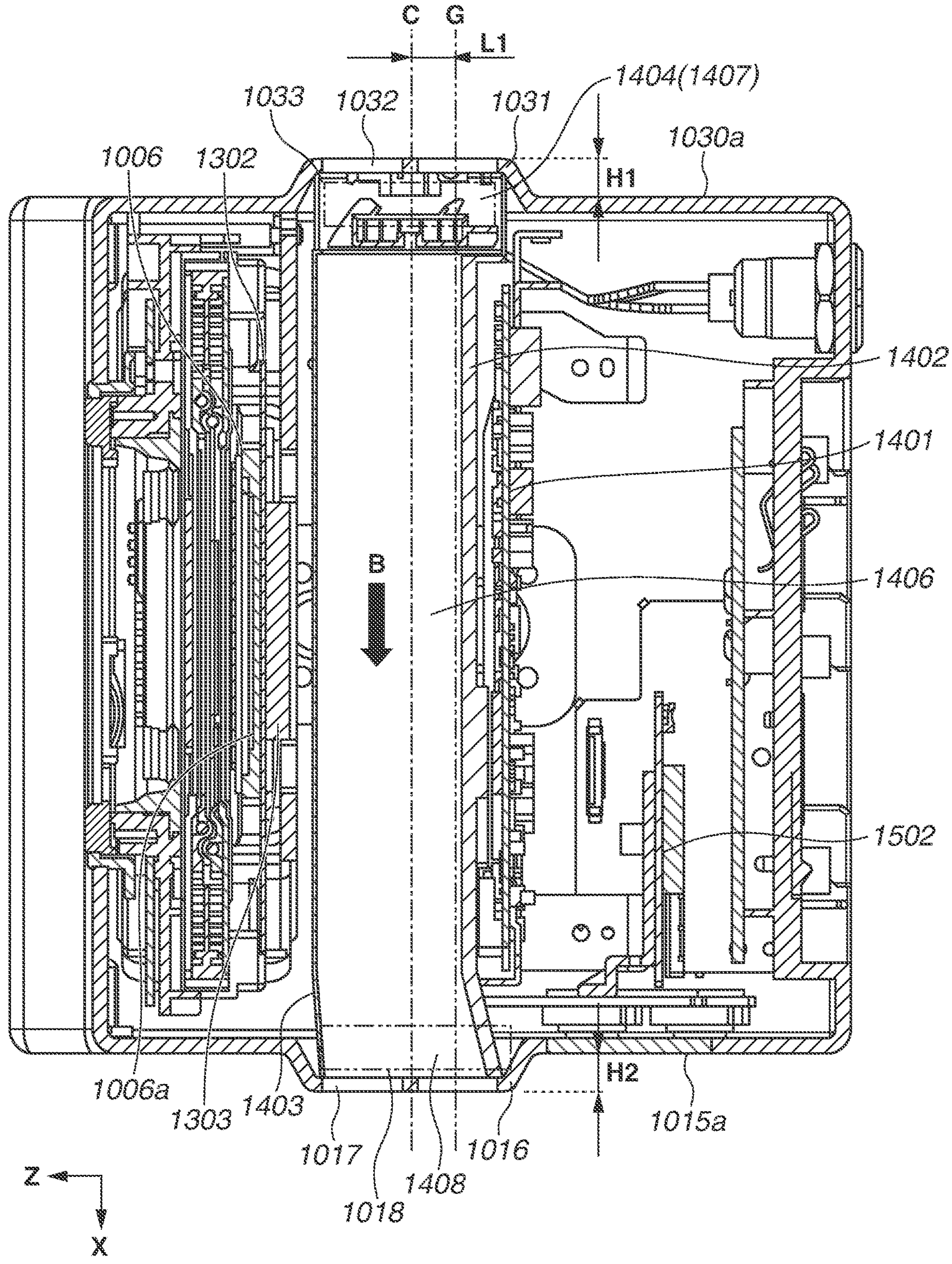
FIG. 9 is an A-A cross-sectional view of the imaging apparatus illustrated in FIG. 8.
Figure 10:
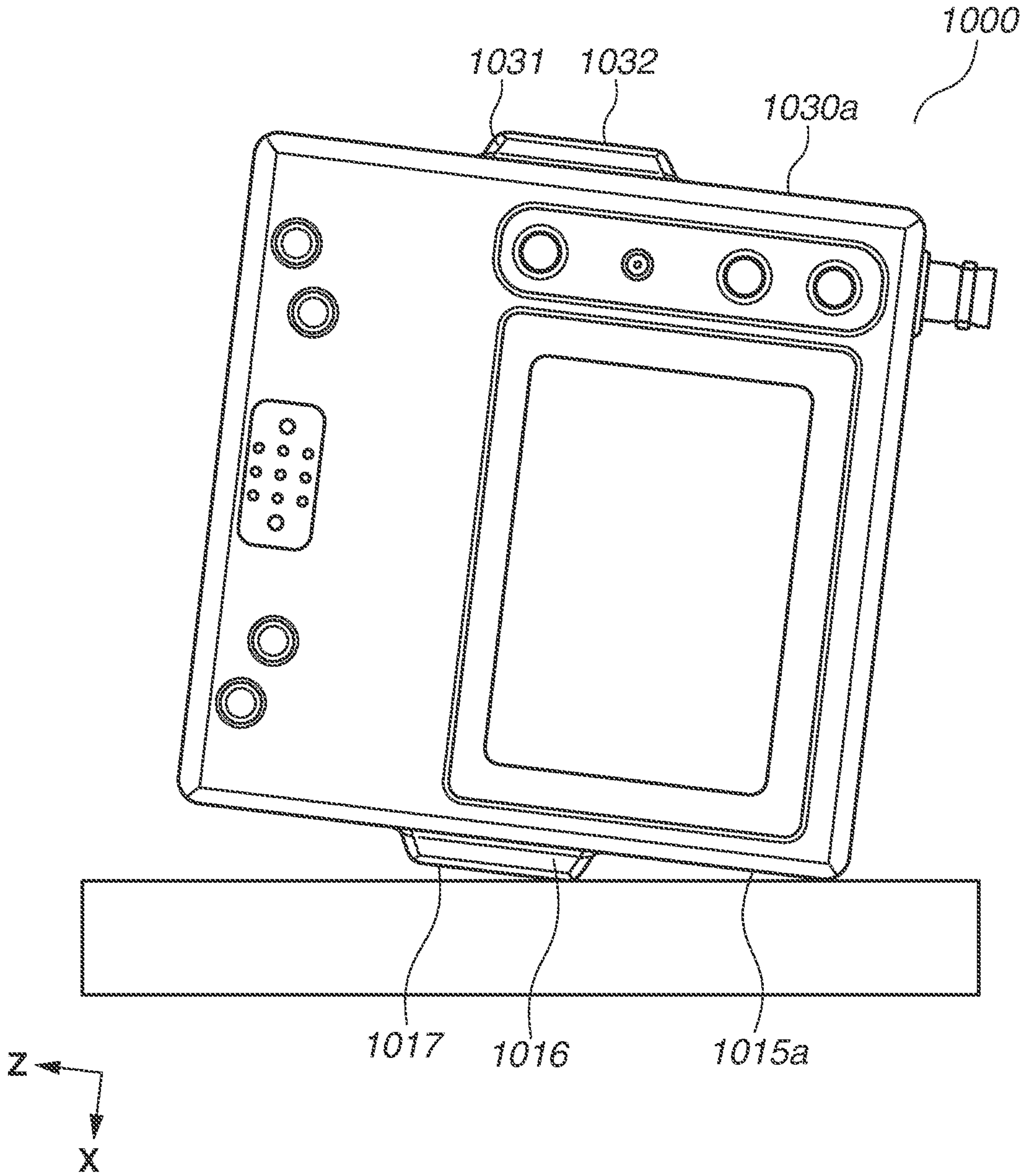
FIG. 10 is a diagram illustrating a state where a right side surface of the imaging apparatus according to the first exemplary embodiment is placed down.

The detailed configurations of the left side surface cover protruding portion 1031 and the right side surface cover protruding portion 1016 will be described with reference to FIGS. 8 to 10. FIG. 8 is a right side view of the imaging apparatus 1000. FIG. 9 is a cross-sectional view of the imaging apparatus 1000 and is an A-A cross-sectional view in FIG. 8. FIG. 10 is a diagram illustrating the state where the right side surface of the imaging apparatus 1000 is placed down.

As illustrated in FIG. 9, inside the imaging apparatus 1000, the image sensor substrate 1302 to which the image sensor 1006 is attached by soldering, the main substrate 1401, and the card substrate 1502 are placed perpendicular to the optical axis 1706 in this order. Between the main substrate 1401 and the image sensor holding plate 1303 placed on the back side of the image sensor substrate 1302 and holding the image sensor 1006, the ventilation duct unit 1406 formed by the heat sink 1402 and the heat dissipation plate 1403 is placed.

The air intake portion 1407 of the ventilation duct unit 1406 in which the fans 1404 are placed is connected to the air intake ports 1032 of the imaging apparatus 1000, and the air exhaust portion 1408 of the ventilation duct unit 1406 is connected to the air exhaust ports 1017 of the imaging apparatus 1000. Cool air is drawn in from the air intake ports 1032 by the rotation of the fans 1404, the air flows in the direction of an arrow B along the heat dissipation fins 1405 (see FIG. 3) in the ventilation duct unit 1406, and hot air resulting from heat exchange inside the ventilation duct unit 1406 is exhausted from the air exhaust ports 1017.

The left side surface cover protruding portion 1031 is placed at a position protruding further by a height H1 than the left side surface cover first surface 1030*a*, which is the main surface of the left side surface cover 1030. The right side surface cover protruding portion 1016 is placed at a position protruding further by a height H2 than the right side surface cover first surface 1015*a*, which is the main surface of the right side surface cover 1015.

In the left side surface cover protruding portion 1031, the air intake ports 1032 are formed. In the right side surface cover protruding portion 1016, the air exhaust ports 1017 are formed. That is, the air intake ports 1032 are placed at a position protruding further by the height H1 than the left side surface cover first surface 1030*a*. The air exhaust ports 1017 are placed at a position protruding further by the height H2 than the right side surface cover first surface 1015*a*.

With such placement, in a case where the left side surface of the imaging apparatus 1000 is placed down on the ground, the ridge line of the left side surface cover protruding portion 1031 and the ridge line of the surface of the left side surface cover first surface 1030*a* contact the ground. In a case where the right side surface of the imaging apparatus 1000 is placed down on the ground, the ridge line of the right side surface cover protruding portion 1016 and the ridge line of the surface of the right side surface cover first surface 1015*a* contact the ground. Thus, the air intake ports 1032 and the air exhaust ports 1017 are not closed by the ground. Thus, it is possible to prevent a breakdown due to a rise in the temperature inside the imaging apparatus 1000 resulting from a decrease in the heat exhaust efficiency of the imaging apparatus 1000.

A one-dot chain line C illustrated in FIG. 9 indicates the center positions in the longitudinal direction of the air intake ports 1032 and the air exhaust ports 1017. A two-dot chain line G indicates the position of the center of gravity in the longitudinal direction of the imaging apparatus 1000. The center positions of the air intake ports 1032 and the air exhaust ports 1017 in the longitudinal direction (the optical axis direction) of the imaging apparatus 1000 are positions away by a distance L1 from the position of the center of gravity in the longitudinal direction of the imaging apparatus 1000.

The one-dot chain line C and the two-dot chain line G are orthogonal to the optical axis 1706. That is, the air intake ports 1032 and the air exhaust ports 1017 are placed at the same positions on the left and right with respect to the longitudinal direction of the imaging apparatus 1000. Thus, air flows in a straight line in the ventilation duct unit 1406, and ventilation resistance is not reduced. This does not decrease the heat exhaust efficiency.

As described above, the center positions of the air intake ports 1032 and the air exhaust ports 1017 in the longitudinal direction of the imaging apparatus 1000 are shifted from the position of the center of gravity in the longitudinal direction of the imaging apparatus 1000, whereby, in a case where the imaging apparatus 1000 is placed on the ground, it is possible to certainly prevent the air intake ports 1032 and the air exhaust ports 1017 from being closed.

As illustrated in FIG. 9, inside the left side surface cover protruding portion 1031, a first internal space 1033 is formed. In the first internal space 1033, the fans 1404 are placed protruding further outward than the left side surface cover first surface 1030*a*.

Similarly, inside the right side surface cover protruding portion 1016, a second internal space 1018 is formed. In the second internal space 1018, the heat sink 1402 and the heat dissipation plate 1403 of the ventilation duct unit 1406 are placed protruding further outward than the right side surface cover first surface 1015*a*.

As described above, heat dissipation structure components are placed in the first internal space 1033 and the second internal space 1018 formed by the protrusion of the left side surface cover protruding portion 1031 and the right side surface cover protruding portion 1016, whereby it is possible to improve the heat dissipation efficiency by enlarging the region of a heat dissipation portion.

Regions protruding outside the main body are only the left side surface cover protruding portion 1031 and the right side surface cover protruding portion 1016, whereby it is possible to minimize the protruding outline of the imaging apparatus 1000. Thus, it is possible to contribute to the downsizing of the imaging apparatus 1000.

In the first internal space 1033 and the second internal space 1018 formed by the protrusion of the left side surface cover protruding portion 1031 and the right side surface cover protruding portion 1016, sealing members for more tightly sealing the ventilation duct unit 1406 and the exterior may be placed. Alternatively, a dustproof filter that prevents dust from being drawn into the ventilation duct unit 1406 may be placed.

As illustrated in FIGS. 1 and 8, near the air exhaust ports 1017 in the right side surface cover protruding portion 1016 of the imaging apparatus 1000, the REC button 1010 and the microphone unit 1012 are placed. Since the air exhaust ports 1017 protrude further by the height H2 than the right side surface cover first surface 1015*a*, the REC button 1010 and the microphone unit 1012 are placed at positions lower by the height H2 than the air exhaust ports 1017.

Thus, even in a case where the right side surface of the imaging apparatus 1000 is placed down on the ground as illustrated in FIG. 10, it is possible to certainly record voice without closing the microphone unit 1012. Even in a case where the right side surface of the imaging apparatus 1000 is placed down on the ground, it is possible to prevent an erroneous operation when the imaging apparatus 1000 is placed on the ground by the REC button 1010 coming into contact with the ground. Instead of the microphone unit 1012, a loudspeaker may be provided. Instead of the REC button 1010, various other operation switches may be provided.

Figure 11:
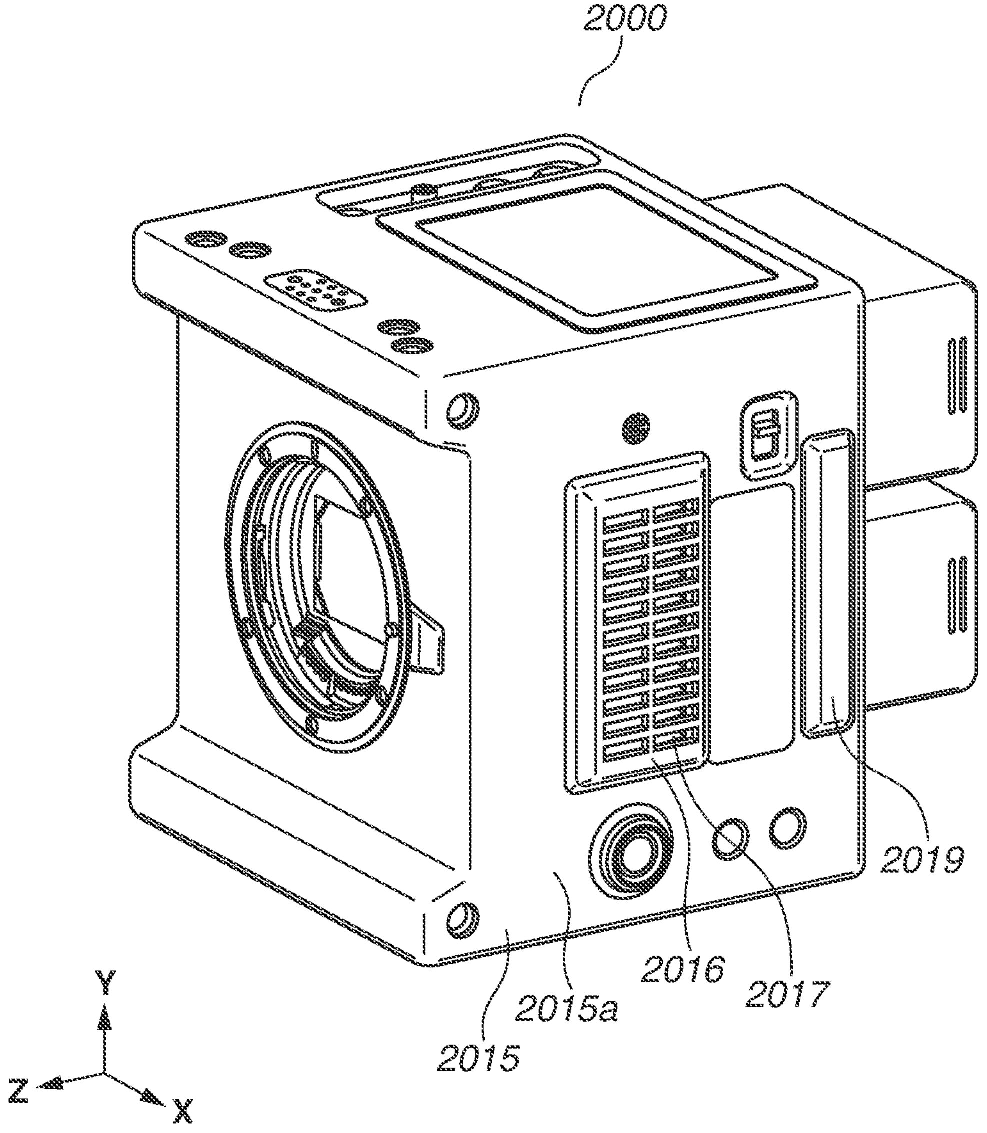
FIG. 11 is a front perspective view illustrating an imaging apparatus according to a second exemplary embodiment.
Figure 12:
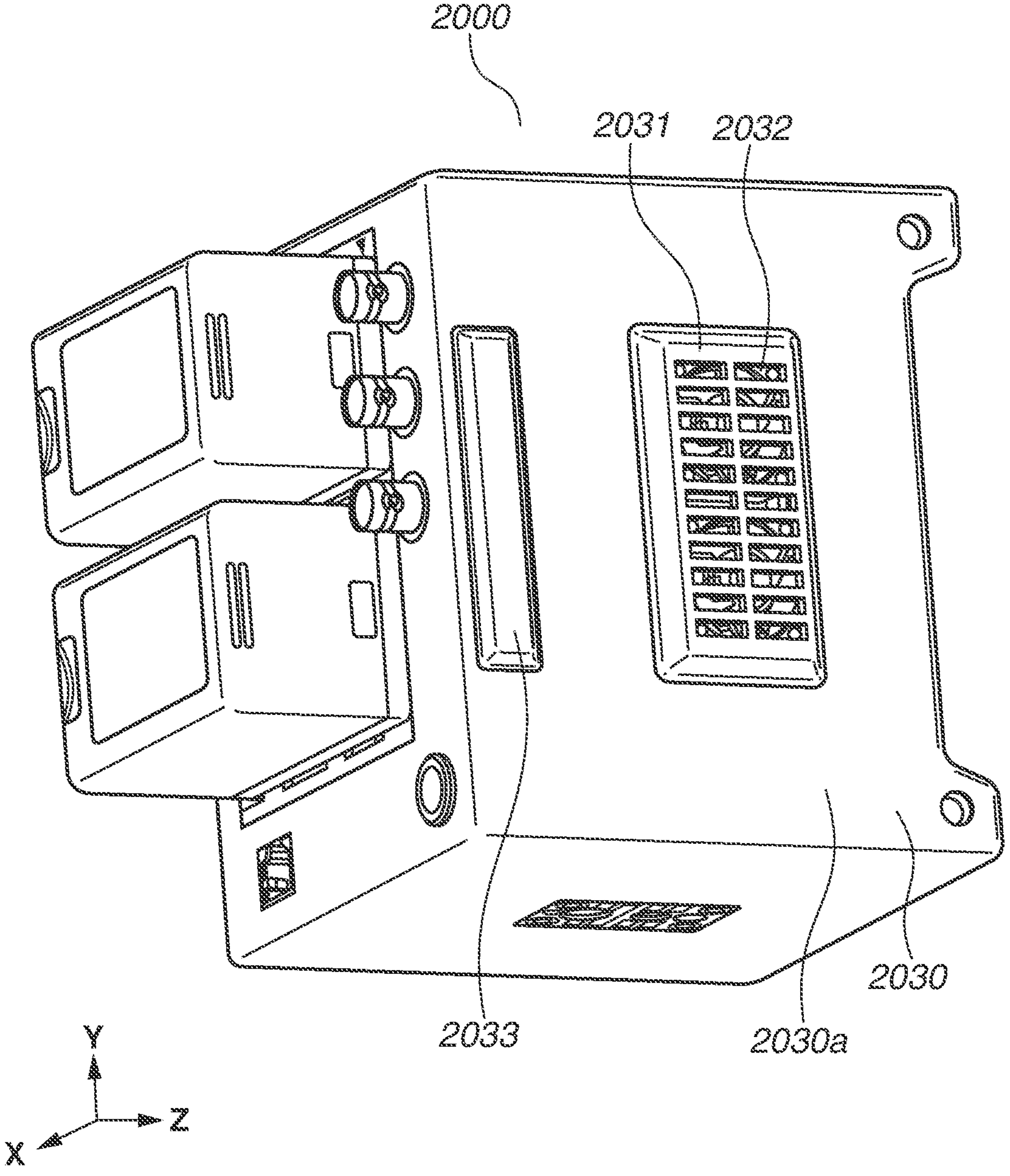
FIG. 12 is a rear perspective view illustrating the imaging apparatus according to the second exemplary embodiment.

A second exemplary embodiment of the present disclosure will be described below with reference to FIGS. 11 to 14. FIG. 11 is a front perspective view of an imaging apparatus according to the second exemplary embodiment of the present disclosure. FIG. 12 is a rear perspective view of the imaging apparatus. FIG. 14 is a diagram illustrating the state where the right side surface of an imaging apparatus 2000 is placed down. The imaging apparatus 2000 according to the present exemplary embodiment has a configuration similar to that of the imaging apparatus 1000 described with reference to FIGS. 1 and 2, except that the imaging apparatus 2000 includes a second protruding portion on each of the left and right side surfaces of the imaging apparatus 2000. Thus, similar portions are not described in detail.

As illustrated in FIGS. 11 and 12, a left side surface cover 2030 of the imaging apparatus 2000 includes a left side surface cover protruding portion 2031 and a second left side surface cover protruding portion 2033 protruding further than a left side surface cover first surface 2030*a*, which is a main surface of the left side surface cover 2030. In the left side surface cover protruding portion 2031, a plurality of air intake ports 2032 is formed that draws low-temperature air from outside the imaging apparatus 2000 into the imaging apparatus 2000 by the driving of the fans 1404 (FIG. 4) placed inside the imaging apparatus 2000.

A right side surface cover 2015 of the imaging apparatus 2000 includes a right side surface cover protruding portion 2016 and a second right side surface cover protruding portion 2019 protruding further than a right side surface cover first surface 2015*a*, which is a main surface of the right side surface cover 2015. In the right side surface cover protruding portion 2016, a plurality of air exhaust ports 2017 is formed that exhausts hot air generated inside the imaging apparatus 2000 to outside the imaging apparatus 2000 by the driving of the fans 1404 (FIG. 4) placed inside the imaging apparatus 2000.

Figure 13:
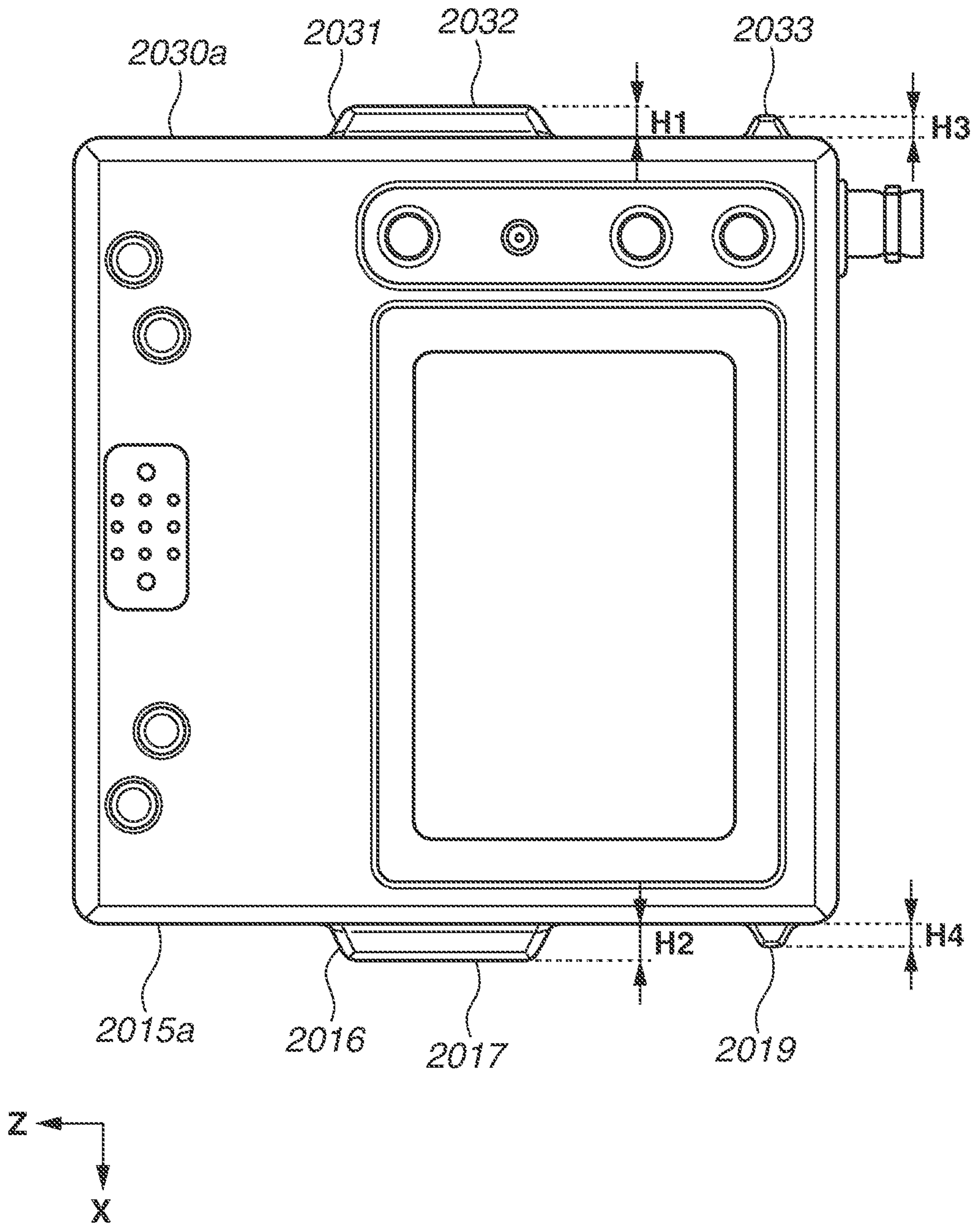
FIG. 13 is a top view illustrating the imaging apparatus according to the second exemplary embodiment.
Figure 14:
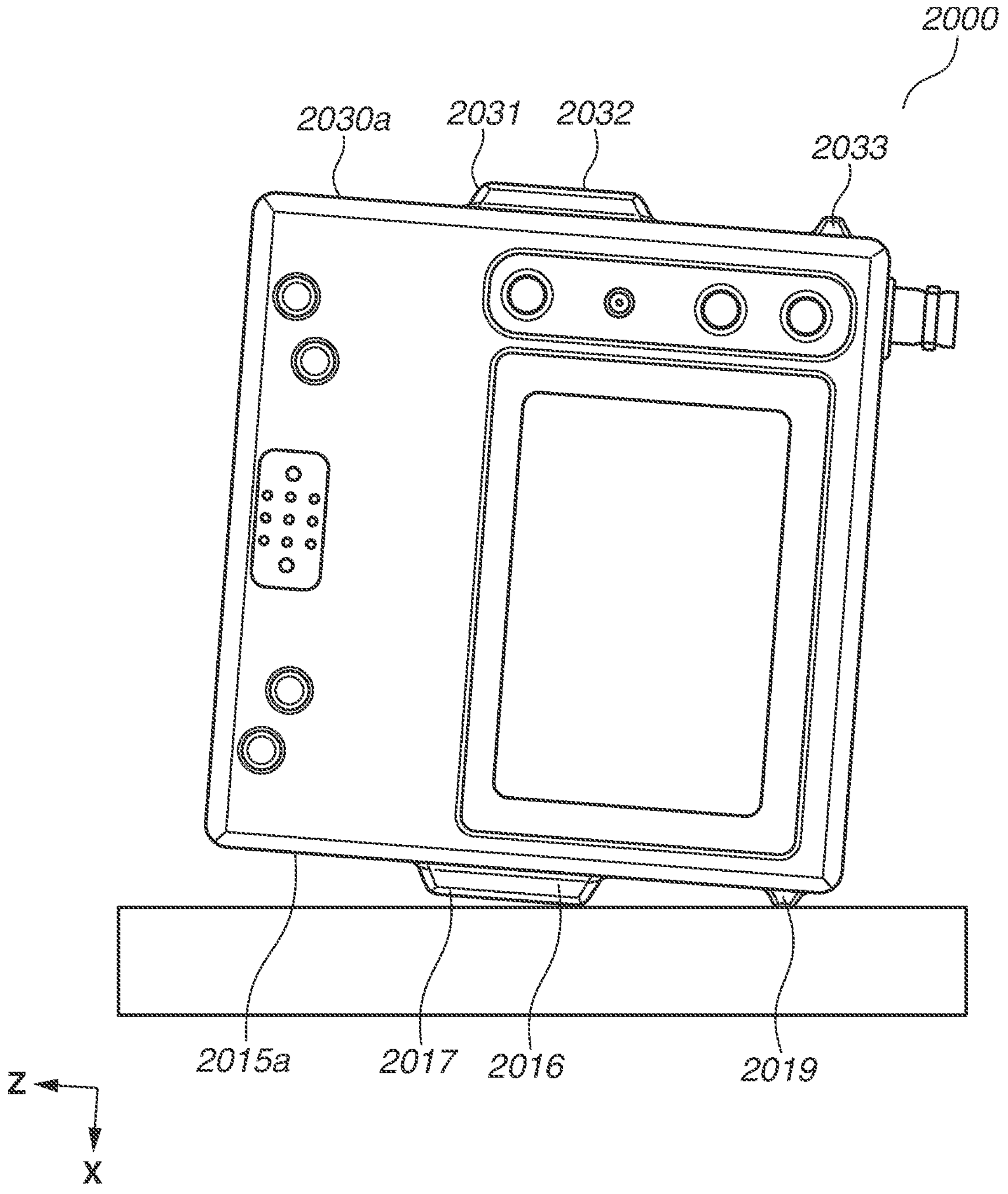
FIG. 14 is a diagram illustrating a state where a right side surface of the imaging apparatus according to the second exemplary embodiment is placed down.

FIG. 13 is a top view of the imaging apparatus 2000. The left side surface cover protruding portion 2031 is placed at a position protruding further by a height H1 than the left side surface cover first surface 2030*a*, which is the main surface of the left side surface cover 2030. The right side surface cover protruding portion 2016 is placed at a position protruding further by a height H2 than the right side surface cover first surface 2015*a*, which is the main surface of the right side surface cover 2015.

In the left side surface cover protruding portion 2031, the air intake ports 2032 are formed. In the right side surface cover protruding portion 2016, the air exhaust ports 2017 are formed. That is, the air intake ports 2032 are placed at a position protruding further by the height H1 than the left side surface cover first surface 2030*a*. The air exhaust ports 2017 are placed at a position protruding further by the height H2 than the right side surface cover first surface 2015*a*.

The second left side surface cover protruding portion 2033 is placed at a position protruding further by a height H3 than the left side surface cover first surface 2030*a*. The second right side surface cover protruding portion 2019 is placed at a position protruding further by a height H4 than the right side surface cover first surface 2015*a*.

The protrusion height H3 of the second left side surface cover protruding portion 2033 is different from the protrusion height H1 of the left side surface cover protruding portion 2031. The protrusion height H4 of the second right side surface cover protruding portion 2019 is different from the protrusion height H2 of the right side surface cover protruding portion 2016. In the present exemplary embodiment, the height H3 is smaller than the height H1, and the height H4 is smaller than the height H2. Alternatively, the height H3 may be greater than the height H1, and the height H4 may be greater than the height H2.

Even in a case where the right side surface of the imaging apparatus 2000 is placed down on the ground as illustrated in FIG. 14, the ridge line of the right side surface cover protruding portion 2016 and the ridge line of the second right side surface cover protruding portion 2019 contact the ground. Even in a case where the left side surface of the imaging apparatus 2000 is placed down on the ground, the ridge line of the left side surface cover protruding portion 2031 and the ridge line of the second left side surface cover protruding portion 2033 contact the ground. Thus, the air intake ports 2032 and the air exhaust ports 2017 are not closed by being in contact with the ground. Thus, it is possible to prevent a breakdown due to a rise in the temperature inside the imaging apparatus 2000 resulting from a decrease in the heat exhaust efficiency of the imaging apparatus 2000.

Inside the second right side surface cover protruding portion 2019 illustrated in FIG. 11 or the second left side surface cover protruding portion 2033 illustrated in FIG. 12, a wireless LAN antenna based on Wi-Fi (registered trademark) may be placed. In this case, the second right side surface cover protruding portion 2019 or the second left side surface cover protruding portion 2033 is made of a resin material (e.g., a polycarbonate resin) that does not block an electromagnetic wave. The second left side surface cover protruding portion 2033 protrudes further than the left side surface cover first surface 2030*a*, and therefore, an electromagnetic wave is not blocked in the periphery of the antenna. Thus, this placement improves the communication performance of the antenna.

Figure 19A:
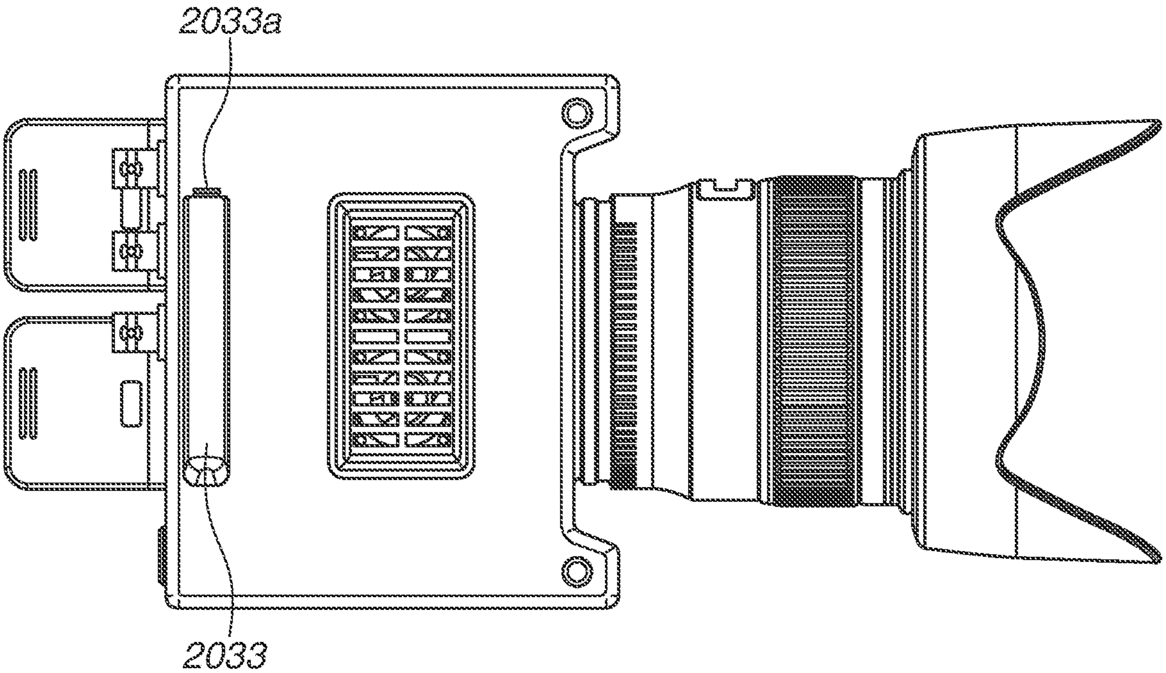
FIGS. 19A and 19B are a left side view and a rear perspective view illustrating an imaging apparatus according to another exemplary embodiment.
Figure 19B:
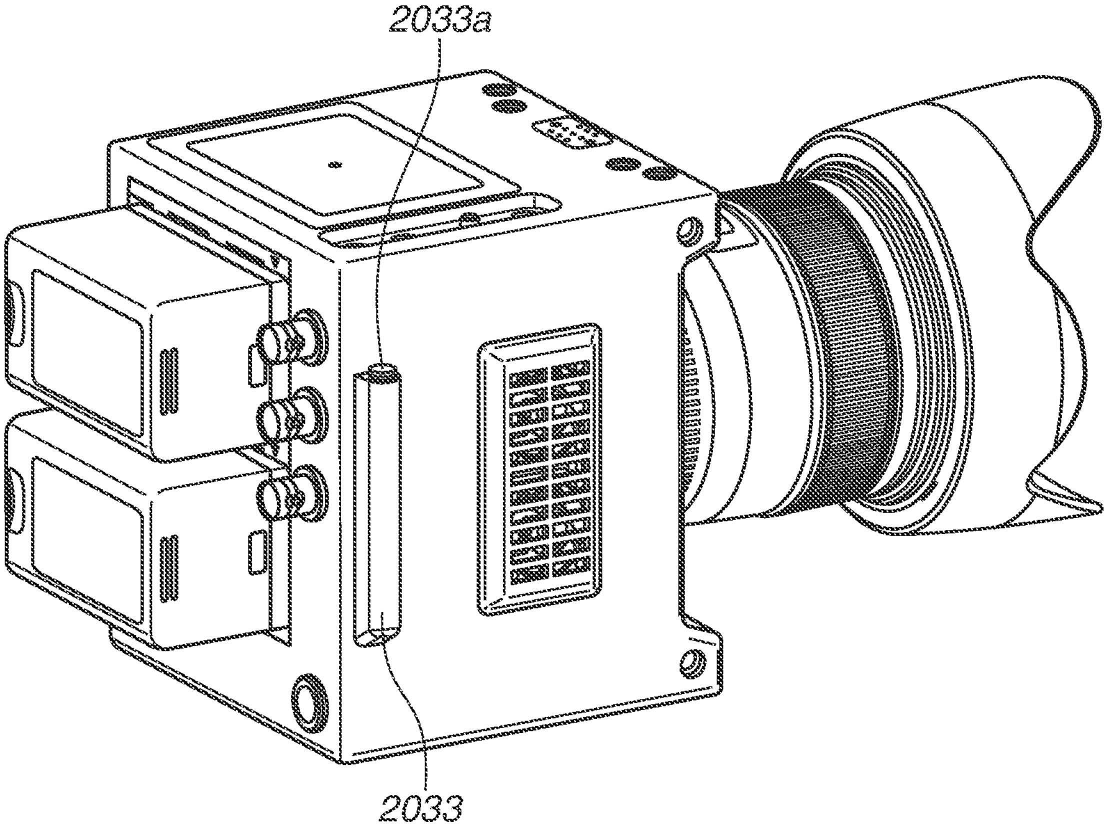

As another exemplary embodiment, as illustrated in FIGS. 19A and 19B, a configuration may be employed in which a wireless LAN antenna is attached to an antenna attachment connector 2033*a* located at either of the top surface side and the bottom surface side of the second left side surface cover protruding portion 2033, or wireless LAN antennas are attached to antenna attachment connectors 2033*a* located on both the top surface side and the bottom surface side of the second left side surface cover protruding portion 2033.

Figure 20A:
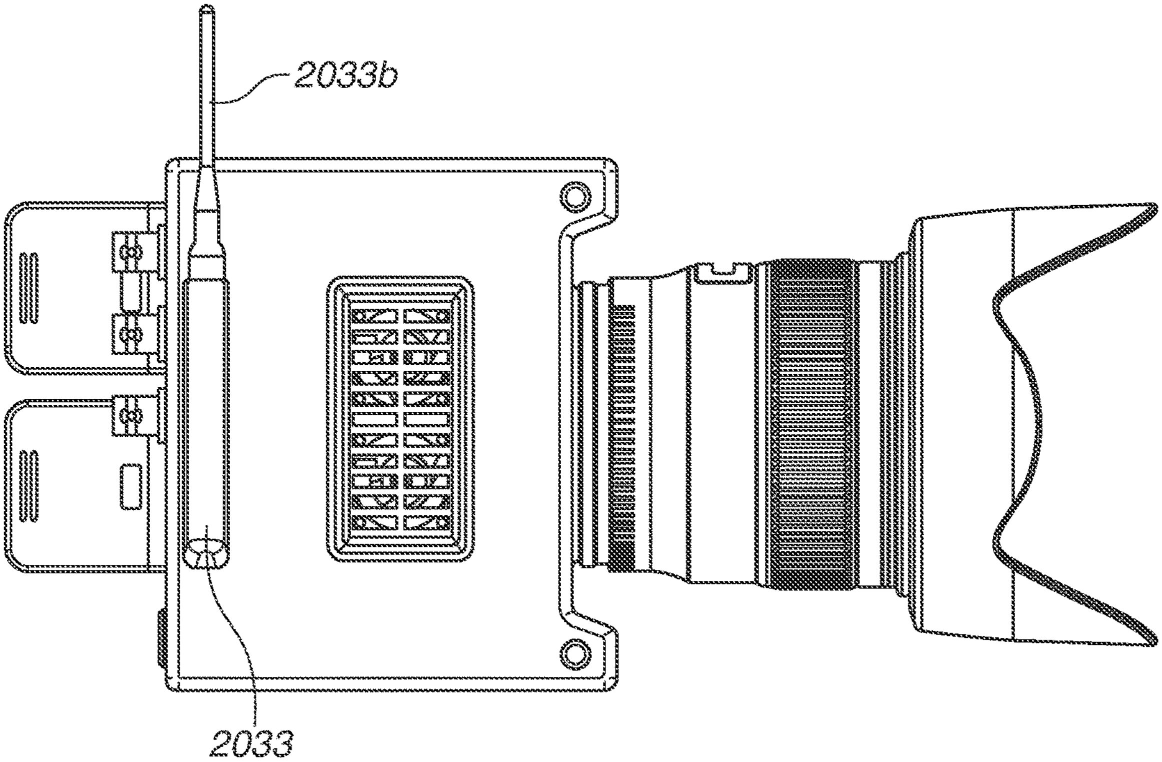
FIGS. 20A and 20B are a left side view and a rear perspective view illustrating the imaging apparatus according to another exemplary embodiment.
Figure 20B:
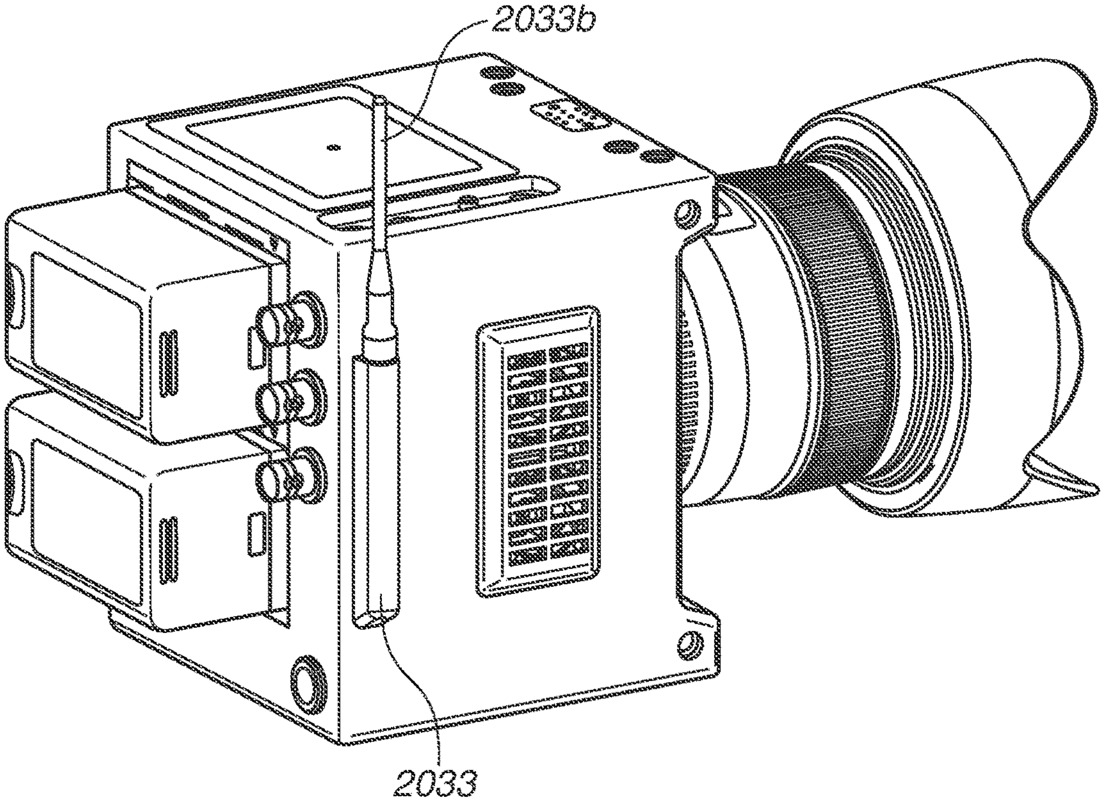
Figure 21A:
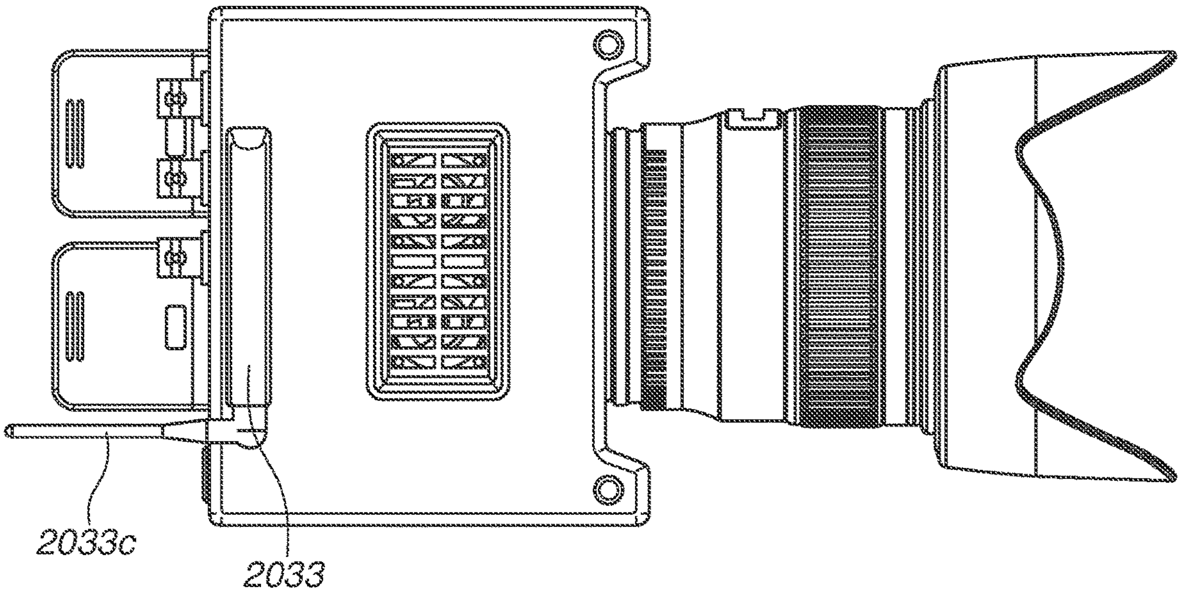
FIGS. 21A and 21B are a left side view and a rear perspective view illustrating the imaging apparatus according to another exemplary embodiment.
Figure 22A:
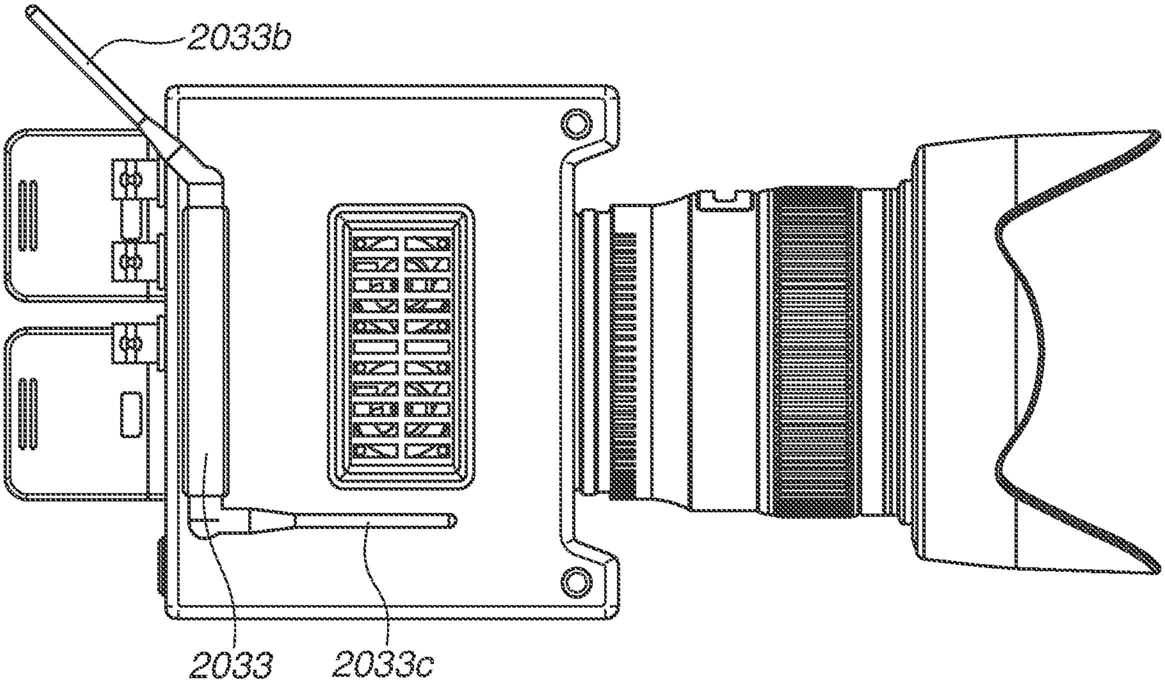
FIGS. 22A and 22B are a left side view and a rear perspective view illustrating the imaging apparatus according to another exemplary embodiment.
Figure 22B:
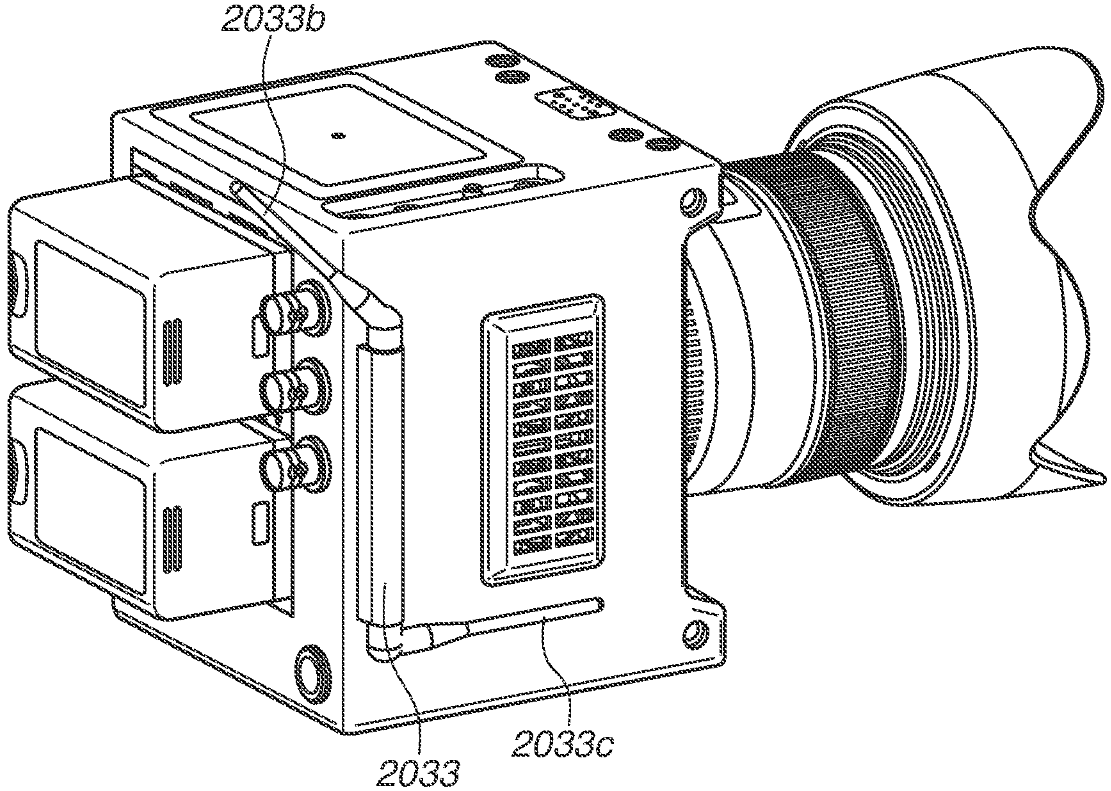

FIGS. 20A and 20B are diagrams illustrating the state where an antenna 2033*b* is attached to the antenna attachment connector 2033*a* provided on the top surface side of the second left side surface cover protruding portion 2033. FIGS. 21A and 21C are diagrams illustrating the state where an antenna 2033*c* is attached to the antenna attachment connector 2033*a* provided on the bottom surface side of the second left side surface cover protruding portion 2033. Further, FIGS. 22A and 22B are diagrams illustrating the state where the two antennas 2033*b* and 2033*c* are attached to the antenna attachment connectors 2033*a* provided on the top surface side and the bottom surface side of the second left side surface cover protruding portion 2033.

Figure 21B:
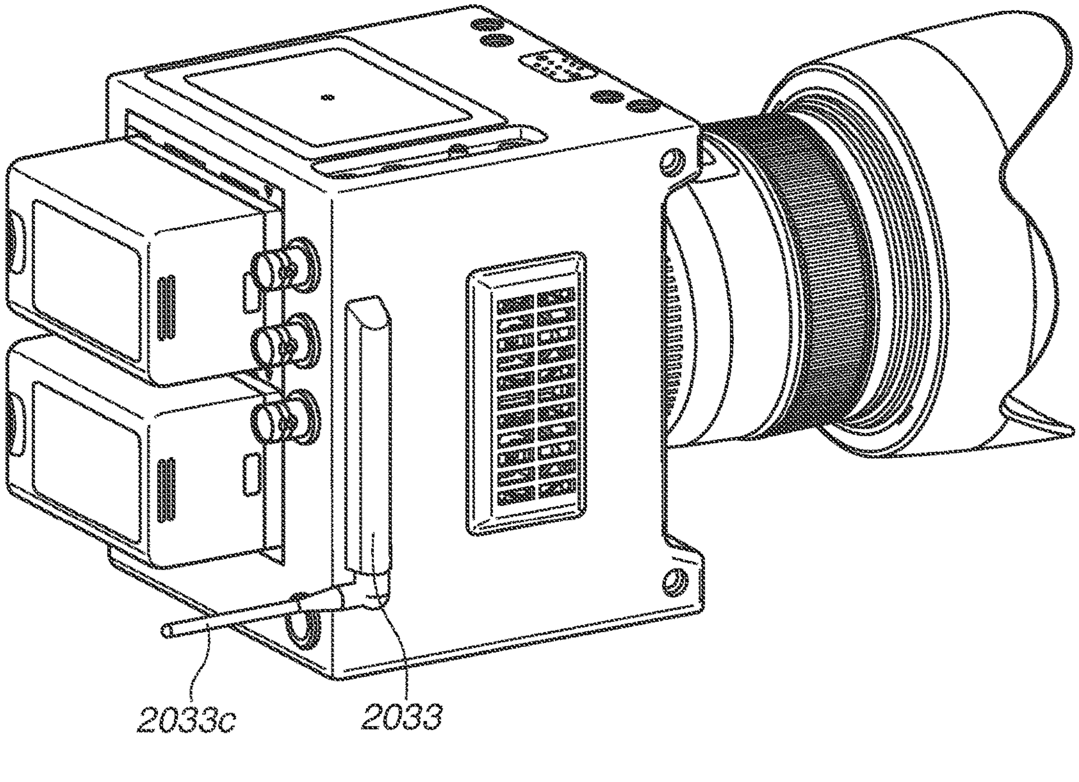

As illustrated in FIGS. 20 to 22, in the state where the antennas 2033*b* and 2033*c* are attached to the connectors 2033*a*, the antennas 2033*b* and 2033*c* can be bent at any angles in the range of up to 180 degrees in the vertical direction and the lateral direction, for example, and the directions of the antennas 2033*b* and 2033*c* can be freely changed. In a case where antennas are attached to both the top surface side and the bottom surface side, the directions of the respective antennas are varied, whereby it is possible to enhance the communication performance of the antennas and perform communication with high receiving sensitivity.

While the present disclosure has been described in detail based on its suitable exemplary embodiments, the present disclosure is not limited to these specific exemplary embodiments. The present disclosure also includes various forms without departing from the spirit and scope of the disclosure.

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may include one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read-only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Applications No. 2020-011247, filed Jan. 27, 2020, and No. 2020-054576, filed Mar. 25, 2020, which are hereby incorporated by reference herein in their entirety.

What is claimed is:

1. An imaging apparatus comprising:

a lens mount which is provided on a front surface of an apparatus main body and to which a lens device is detachably attachable;

an air intake port formed in a first protruding portion on a first side surface of the apparatus main body, the first protruding portion having a height H1 relative to the first side surface;

an air exhaust port formed in a second protruding portion on a second side surface of the apparatus main body that is different from the first side surface;

a duct unit configured to exhaust air taken in through the air intake port from the air exhaust port; and a third protruding portion which is provided on the first side surface and which is different from the first protruding portion, the third protruding portion having a height H3 relative to the first side surface;

wherein a connecter to which an antenna for wireless local area network (LAN) is attached is provided on the third protruding portion, and wherein H1 is different from H3 such that the air intake port is not blocked if the imaging apparatus main body is placed upon a flat surface with at least one of the first protrusion and the third protrusion contacting the flat surface.

2. The imaging apparatus according to claim 1, wherein the first side surface and the second side surface are side surfaces of the apparatus main body that are opposed to each other.

3. The imaging apparatus according to claim 1, wherein center positions of the air intake port and the air exhaust port are shifted in a front-back direction from a position of a center of gravity of the apparatus main body.

4. The imaging apparatus according to claim 1, further comprising:

an axial flow fan placed in an internal space of the first protruding portion and configured to take in air from the air intake port;

wherein the duct unit includes a plurality of heat dissipations fins in the duct unit, and wherein the axial flow fan blows air taken in from the air intake port to side surfaces of the plurality of heat dissipation fins.

5. The imaging apparatus according to claim 1, wherein the connecter is provided on at least one of a top surface side or a bottom side of the third protruding portion.

6. The imaging apparatus according to claim 1, wherein an image sensor configured to convert an optical image of an object acquired by the lens device into an electric signal is provided in the front surface of the apparatus main body.

7. The imaging apparatus according to claim 6, wherein the image sensor includes a plurality of phase difference detection pixels.

8. The imaging apparatus according to claim 6, wherein a flange focal distance, which is a distance from a mount surface of the lens mount to an imaging surface of the image sensor, is 20 millimeters (mm) or less, and wherein an inner diameter of the lens mount is set to 45 mm or more.

9. The imaging apparatus according to claim 8, wherein the lens mount includes three bayonet claws and a ring-shaped mount reference surface, and wherein the three bayonet claws are provided at a distance to a center of the lens mount that is less than a distance of the ring-shaped mount reference surface to the center of the lens mount.

10. The imaging apparatus according to claim 9, wherein the lens mount further includes a camera-side contact portion for communicating with the lens device, and wherein the camera-side contact portion is provided at a distance to the center of the lens mount that is less than the distance of the three bayonet claws to the center of the lens mount.

11. The imaging apparatus according to claim 10, wherein the camera-side contact portion includes a 12-pin electric contact.

12. The imaging apparatus according to claim 11, wherein each end of the 12-pin electric contact respectively includes (i) a power supply terminal for supplying power, which is configured to be used for a communication control performed between the imaging apparatus and the lens device, from a power source unit of the imaging apparatus to the lens device, and includes (ii) a ground terminal for grounding a communication control circuit of the imaging apparatus and the lens device.

13. The imaging apparatus according to claim 12, wherein a voltage of the power supplied to the lens device by the power supply terminal is set to 5.0 volts (V).

14. The imaging apparatus according to claim 6, further comprising:

an image sensor substrate on which the image sensor is mounted; and a main substrate on which a video signal processing unit is mounted, wherein the image sensor substrate is provided closer to the front surface of the apparatus main body than the duct unit, and wherein the main substrate is provided closer to a back surface of the apparatus main body than the duct unit.

15. The imaging apparatus according to claim 14, wherein the video signal processing unit is configured to generate video data based on a video signal output from the image sensor.

16. The imaging apparatus according to claim 1, wherein a display unit and operation keys are provided on an upper surface of the apparatus main body.

17. The imaging apparatus according to claim 1, wherein (i) a battery attachment portion, to which a battery is detachably attachable, and (ii) external input/output terminals are provided on a back surface of the apparatus main body.

18. The imaging apparatus according to claim 1, wherein a tripod thread portion, configured to fix the apparatus main body to a tripod or other structure configured to couple with the tripod thread portion, is provided on a lower surface of the apparatus main body.

* * * * *